(12) United States Patent
Nguyen et al.

(10) Patent No.: US 9,633,723 B2
(45) Date of Patent: *Apr. 25, 2017

(54) HIGH OPERATING SPEED RESISTIVE RANDOM ACCESS MEMORY

(71) Applicant: Crossbar, Inc., Santa Clara, CA (US)

(72) Inventors: Sang Nguyen, Union City, CA (US); Hagop Nazarian, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/383,079

(22) PCT Filed: May 24, 2013

(86) PCT No.: PCT/US2013/042746
§ 371 (c)(1),
(2) Date: Sep. 4, 2014

(87) PCT Pub. No.: WO2013/177566
PCT Pub. Date: Nov. 28, 2013

(65) Prior Publication Data
US 2015/0009745 A1   Jan. 8, 2015

Related U.S. Application Data

(63) Continuation of application No. 13/481,696, filed on May 25, 2012, now Pat. No. 8,619,459.
(Continued)

(51) Int. Cl.
*G11C 13/00* (2006.01)
*G11C 5/06* (2006.01)
(Continued)

(52) U.S. Cl.
CPC .......... *G11C 13/004* (2013.01); *G11C 13/003* (2013.01); *G11C 13/0007* (2013.01);
(Continued)

(58) Field of Classification Search
CPC .............. G11C 13/004; G11C 13/0007; G11C 13/0002; G11C 13/003; G11C 2213/79; G11C 13/0004; G11C 11/419; G11C 7/00
(Continued)

(56) References Cited

U.S. PATENT DOCUMENTS

| 680,652 A | 8/1901 | Leonard |
| 4,433,468 A | 2/1984 | Kawamata |

(Continued)

FOREIGN PATENT DOCUMENTS

| CN | 101131872 A | 2/2008 |
| CN | 101170132 A | 4/2008 |

(Continued)

OTHER PUBLICATIONS

International Search Report for PCT/US2013/042746, mailed Sep. 6, 2013.
(Continued)

*Primary Examiner* — Ly D Pham
(74) *Attorney, Agent, or Firm* — Amin, Turocy & Watson, LLP

(57) ABSTRACT

Providing for resistive random access memory (RRAM) having high read speeds is described herein. By way of example, a RRAM memory can be powered at one terminal by a bitline, and connected at another terminal to a gate of a transistor having a low gate capacitance (relative to a capacitance of the bitline). With this arrangement, a signal applied at the bitline can quickly switch the transistor gate, in response to the RRAM memory being in a conductive state. A sensing circuit configured to measure the transistor can detect a change in current, voltage, etc., of the transistor and determine a state of the RRAM memory from the measurement. Moreover, this measurement can occur very (Continued)

quickly due to the low capacitance of the transistor gate, greatly improving the read speed of RRAM.

20 Claims, 11 Drawing Sheets

Related U.S. Application Data

(60) Provisional application No. 61/500,574, filed on Jun. 23, 2011.

(51) Int. Cl.
  *G11C 16/26* (2006.01)
  *G11C 7/00* (2006.01)
  *G11C 7/06* (2006.01)
  *G11C 11/419* (2006.01)

(52) U.S. Cl.
  CPC ........ *G11C 13/0097* (2013.01); *G11C 11/419* (2013.01); *G11C 13/0004* (2013.01); *G11C 2013/0042* (2013.01); *G11C 2013/0052* (2013.01); *G11C 2213/53* (2013.01); *G11C 2213/74* (2013.01); *G11C 2213/78* (2013.01); *G11C 2213/79* (2013.01)

(58) Field of Classification Search
  USPC ............. 365/148, 163, 63, 189.15, 205, 207
  See application file for complete search history.

(56) References Cited

U.S. PATENT DOCUMENTS

| | | | |
|---|---|---|---|
| 4,684,972 A | 8/1987 | Owen et al. | |
| 4,741,601 A | 5/1988 | Saito | |
| 4,994,866 A | 2/1991 | Awano | |
| 5,139,911 A | 8/1992 | Yagi et al. | |
| 5,242,855 A | 9/1993 | Oguro | |
| 5,278,085 A | 1/1994 | Maddox, III et al. | |
| 5,315,131 A | 5/1994 | Kishimoto et al. | |
| 5,335,219 A | 8/1994 | Ovshinsky et al. | |
| 5,360,981 A | 11/1994 | Owen et al. | |
| 5,457,649 A | 10/1995 | Eichman et al. | |
| 5,499,208 A | 3/1996 | Shoji | |
| 5,538,564 A | 7/1996 | Kaschmitter | |
| 5,541,869 A | 7/1996 | Rose et al. | |
| 5,594,363 A | 1/1997 | Freeman et al. | |
| 5,596,214 A | 1/1997 | Endo | |
| 5,614,756 A | 3/1997 | Forouhi et al. | |
| 5,627,451 A | 5/1997 | Takeda | |
| 5,645,628 A | 7/1997 | Endo et al. | |
| 5,673,223 A | 9/1997 | Park | |
| 5,707,487 A | 1/1998 | Hori et al. | |
| 5,714,416 A | 2/1998 | Eichman et al. | |
| 5,751,012 A | 5/1998 | Wolstenholme et al. | |
| 5,763,898 A | 6/1998 | Forouhi et al. | |
| 5,840,608 A | 11/1998 | Chang | |
| 5,923,587 A | 7/1999 | Choi | |
| 5,970,332 A | 10/1999 | Pruijmboom et al. | |
| 5,973,335 A | 10/1999 | Shannon | |
| 5,998,244 A | 12/1999 | Wolstenholme et al. | |
| 6,002,268 A | 12/1999 | Sasaki et al. | |
| 6,037,204 A | 3/2000 | Chang et al. | |
| 6,122,318 A | 9/2000 | Yamaguchi et al. | |
| 6,128,214 A | 10/2000 | Kuekes et al. | |
| 6,143,642 A | 11/2000 | Sur, Jr. et al. | |
| 6,180,998 B1 | 1/2001 | Crafts | |
| 6,181,587 B1 | 1/2001 | Kuramoto et al. | |
| 6,181,597 B1 | 1/2001 | Nachumovsky | |
| 6,259,116 B1 | 7/2001 | Shannon | |
| 6,288,435 B1 | 9/2001 | Mei et al. | |
| 6,291,836 B1 | 9/2001 | Kramer et al. | |
| 6,436,765 B1 | 8/2002 | Liou et al. | |
| 6,436,818 B1 | 8/2002 | Hu et al. | |
| 6,492,694 B2 | 12/2002 | Noble et al. | |
| 6,552,932 B1 | 4/2003 | Cernea | |
| 6,627,530 B2 | 9/2003 | Li et al. | |
| 6,724,186 B2 * | 4/2004 | Jordil .................... | G01B 3/205 324/207.21 |
| 6,731,535 B1 | 5/2004 | Ooishi et al. | |
| 6,740,921 B2 | 5/2004 | Matsuoka et al. | |
| 6,762,474 B1 | 7/2004 | Mills, Jr. | |
| 6,768,157 B2 | 7/2004 | Krieger et al. | |
| 6,815,286 B2 | 11/2004 | Krieger et al. | |
| 6,816,405 B1 | 11/2004 | Lu et al. | |
| 6,821,879 B2 | 11/2004 | Wong | |
| 6,838,720 B2 | 1/2005 | Krieger et al. | |
| 6,848,012 B2 | 1/2005 | LeBlanc et al. | |
| 6,849,891 B1 | 2/2005 | Hsu et al. | |
| 6,858,481 B2 | 2/2005 | Krieger et al. | |
| 6,858,482 B2 | 2/2005 | Gilton | |
| 6,864,127 B2 | 3/2005 | Yamazaki et al. | |
| 6,864,522 B2 | 3/2005 | Krieger et al. | |
| 6,867,618 B2 | 3/2005 | Li et al. | |
| 6,881,994 B2 | 4/2005 | Lee et al. | |
| 6,897,519 B1 | 5/2005 | Dosluoglu | |
| 6,927,430 B2 | 8/2005 | Hsu | |
| 6,939,787 B2 | 9/2005 | Ohtake et al. | |
| 6,946,719 B2 | 9/2005 | Petti et al. | |
| 7,020,006 B2 | 3/2006 | Chevallier et al. | |
| 7,023,093 B2 | 4/2006 | Canaperi et al. | |
| 7,026,702 B2 | 4/2006 | Krieger et al. | |
| 7,087,454 B2 | 8/2006 | Campbell et al. | |
| 7,102,150 B2 | 9/2006 | Harshfield et al. | |
| 7,122,853 B1 | 10/2006 | Gaun et al. | |
| 7,167,387 B2 | 1/2007 | Sugita et al. | |
| 7,187,577 B1 | 3/2007 | Wang et al. | |
| 7,221,599 B1 | 5/2007 | Gaun et al. | |
| 7,238,607 B2 | 7/2007 | Dunton et al. | |
| 7,238,994 B2 | 7/2007 | Chen et al. | |
| 7,251,152 B2 | 7/2007 | Roehr | |
| 7,254,053 B2 | 8/2007 | Krieger et al. | |
| 7,274,587 B2 | 9/2007 | Yasuda | |
| 7,289,353 B2 | 10/2007 | Spitzer et al. | |
| 7,324,363 B2 | 1/2008 | Kerns et al. | |
| 7,345,907 B2 | 3/2008 | Scheuerlein | |
| 7,365,411 B2 | 4/2008 | Campbell | |
| 7,405,418 B2 | 7/2008 | Happ et al. | |
| 7,426,128 B2 | 9/2008 | Scheuerlein | |
| 7,433,253 B2 | 10/2008 | Gogl et al. | |
| 7,474,000 B2 | 1/2009 | Scheuerlein et al. | |
| 7,479,650 B2 | 1/2009 | Gilton | |
| 7,499,355 B2 | 3/2009 | Scheuerlein et al. | |
| 7,515,454 B2 | 4/2009 | Symanczyk | |
| 7,521,705 B2 | 4/2009 | Liu | |
| 7,534,625 B2 | 5/2009 | Karpov et al. | |
| 7,541,252 B2 | 6/2009 | Eun et al. | |
| 7,550,380 B2 | 6/2009 | Elkins et al. | |
| 7,561,461 B2 | 7/2009 | Nagai et al. | |
| 7,566,643 B2 | 7/2009 | Czubatyi et al. | |
| 7,606,059 B2 | 10/2009 | Toda | |
| 7,615,439 B1 | 11/2009 | Schricker et al. | |
| 7,629,198 B2 | 12/2009 | Kumar et al. | |
| 7,667,442 B2 | 2/2010 | Itoh | |
| 7,692,959 B2 | 4/2010 | Krusin-Elbaum et al. | |
| 7,704,788 B2 | 4/2010 | Youn et al. | |
| 7,719,001 B2 | 5/2010 | Nomura et al. | |
| 7,728,318 B2 | 6/2010 | Raghuram et al. | |
| 7,729,158 B2 | 6/2010 | Toda et al. | |
| 7,746,601 B2 | 6/2010 | Sugiyama et al. | |
| 7,746,696 B1 | 6/2010 | Paak | |
| 7,749,805 B2 | 7/2010 | Pinnow et al. | |
| 7,764,536 B2 | 7/2010 | Luo et al. | |
| 7,772,581 B2 | 8/2010 | Lung | |
| 7,776,682 B1 | 8/2010 | Nickel et al. | |
| 7,778,063 B2 | 8/2010 | Brubaker et al. | |
| 7,786,464 B2 | 8/2010 | Nirschl et al. | |
| 7,786,589 B2 | 8/2010 | Matsunaga et al. | |
| 7,791,060 B2 | 9/2010 | Aochi et al. | |
| 7,824,956 B2 | 11/2010 | Schricker et al. | |
| 7,829,875 B2 | 11/2010 | Scheuerlein | |
| 7,830,698 B2 | 11/2010 | Chen et al. | |
| 7,835,170 B2 | 11/2010 | Bertin et al. | |
| 7,858,468 B2 | 12/2010 | Liu et al. | |

(56) References Cited

U.S. PATENT DOCUMENTS

| | | |
|---|---|---|
| 7,859,884 B2 | 12/2010 | Scheuerlein |
| 7,869,253 B2 | 1/2011 | Liaw et al. |
| 7,875,871 B2 | 1/2011 | Kumar et al. |
| 7,881,097 B2 | 2/2011 | Hosomi et al. |
| 7,883,964 B2 | 2/2011 | Goda et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,927,472 B2 | 4/2011 | Takahashi et al. |
| 7,968,419 B2 | 6/2011 | Li et al. |
| 7,972,897 B2 | 7/2011 | Kumar et al. |
| 7,984,776 B2 | 7/2011 | Sastry et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,054,679 B2 | 11/2011 | Nakai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,018 B2 | 1/2012 | Bertin et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Sastry et al. |
| 8,233,308 B2 | 7/2012 | Schricker et al. |
| 8,237,146 B2 | 8/2012 | Kreupl et al. |
| 8,243,542 B2 | 8/2012 | Bae et al. |
| 8,258,020 B2 | 9/2012 | Herner |
| 8,265,136 B2 | 9/2012 | Hong et al. |
| 8,274,130 B2 | 9/2012 | Mihnea et al. |
| 8,274,812 B2 | 9/2012 | Nazarian et al. |
| 8,305,793 B2 | 11/2012 | Majewski et al. |
| 8,315,079 B2 | 11/2012 | Kuo et al. |
| 8,320,160 B2 | 11/2012 | Nazarian |
| 8,351,241 B2 | 1/2013 | Lu et al. |
| 8,369,129 B2 | 2/2013 | Fujita et al. |
| 8,369,139 B2 | 2/2013 | Liu et al. |
| 8,374,018 B2 | 2/2013 | Lu |
| 8,385,100 B2 | 2/2013 | Kau et al. |
| 8,389,971 B2 | 3/2013 | Chen et al. |
| 8,394,670 B2 | 3/2013 | Herner |
| 8,399,307 B2 | 3/2013 | Herner |
| 8,441,835 B2 | 5/2013 | Jo et al. |
| 8,456,892 B2 | 6/2013 | Yasuda |
| 8,466,005 B2 | 6/2013 | Pramanik et al. |
| 8,467,226 B2 | 6/2013 | Bedeschi et al. |
| 8,467,227 B1 | 6/2013 | Jo |
| 8,502,185 B2 | 8/2013 | Lu et al. |
| 8,569,104 B2 | 10/2013 | Pham et al. |
| 8,587,989 B2 | 11/2013 | Manning et al. |
| 8,619,459 B1 * | 12/2013 | Nguyen et al. ............... 365/148 |
| 8,658,476 B1 | 2/2014 | Sun et al. |
| 8,659,003 B2 | 2/2014 | Herner et al. |
| 8,675,384 B2 | 3/2014 | Kuo et al. |
| 8,693,241 B2 | 4/2014 | Kim et al. |
| 8,853,759 B2 | 10/2014 | Lee et al. |
| 8,934,294 B2 | 1/2015 | Kim et al. |
| 8,946,667 B1 | 2/2015 | Clark et al. |
| 8,946,673 B1 | 2/2015 | Kumar |
| 8,947,908 B2 | 2/2015 | Jo |
| 8,999,811 B2 | 4/2015 | Endo et al. |
| 9,093,635 B2 | 7/2015 | Kim et al. |
| 9,166,163 B2 | 10/2015 | Gee et al. |
| 2002/0048940 A1 | 4/2002 | Derderian et al. |
| 2003/0006440 A1 | 1/2003 | Uchiyama |
| 2003/0036238 A1 | 2/2003 | Toet et al. |
| 2003/0052330 A1 | 3/2003 | Klein |
| 2003/0141565 A1 | 7/2003 | Hirose et al. |
| 2003/0174574 A1 | 9/2003 | Perner et al. |
| 2003/0194865 A1 | 10/2003 | Gilton |
| 2003/0206659 A1 | 11/2003 | Hamanaka |
| 2004/0026682 A1 | 2/2004 | Jiang |
| 2004/0036124 A1 | 2/2004 | Vyvoda et al. |
| 2004/0159835 A1 | 8/2004 | Krieger et al. |
| 2004/0170040 A1 | 9/2004 | Rinerson et al. |
| 2004/0192006 A1 | 9/2004 | Campbell et al. |
| 2004/0194340 A1 | 10/2004 | Kobayashi |
| 2004/0202041 A1 | 10/2004 | Hidenori |
| 2005/0019699 A1 | 1/2005 | Moore |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0101081 A1 | 5/2005 | Goda et al. |
| 2005/0175099 A1 | 8/2005 | Sarkijarvi et al. |
| 2006/0017488 A1 | 1/2006 | Hsu et al. |
| 2006/0054950 A1 | 3/2006 | Baek et al. |
| 2006/0134837 A1 | 6/2006 | Subramanian et al. |
| 2006/0154417 A1 | 7/2006 | Shinmura et al. |
| 2006/0215445 A1 | 9/2006 | Baek et al. |
| 2006/0231910 A1 | 10/2006 | Hsieh et al. |
| 2006/0246606 A1 | 11/2006 | Hsu et al. |
| 2006/0279979 A1 | 12/2006 | Lowrey et al. |
| 2006/0281244 A1 | 12/2006 | Ichige et al. |
| 2006/0286762 A1 | 12/2006 | Tseng et al. |
| 2007/0008773 A1 | 1/2007 | Scheuerlein |
| 2007/0015348 A1 | 1/2007 | Hsu et al. |
| 2007/0025144 A1 | 2/2007 | Hsu et al. |
| 2007/0035990 A1 | 2/2007 | Hush |
| 2007/0042612 A1 | 2/2007 | Nishino et al. |
| 2007/0045615 A1 | 3/2007 | Cho et al. |
| 2007/0069119 A1 | 3/2007 | Appleyard et al. |
| 2007/0087508 A1 | 4/2007 | Herner et al. |
| 2007/0090425 A1 | 4/2007 | Kumar et al. |
| 2007/0091685 A1 | 4/2007 | Guterman et al. |
| 2007/0105284 A1 | 5/2007 | Herner et al. |
| 2007/0105390 A1 | 5/2007 | Oh |
| 2007/0133250 A1 | 6/2007 | Kim |
| 2007/0133270 A1 * | 6/2007 | Jeong ............... G11C 11/5678 365/163 |
| 2007/0159869 A1 | 7/2007 | Baek et al. |
| 2007/0159876 A1 * | 7/2007 | Sugibayashi et al. .. G11C 11/16 365/158 |
| 2007/0171698 A1 | 7/2007 | Hoenigschmid et al. |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0007987 A1 | 1/2008 | Takashima |
| 2008/0019163 A1 | 1/2008 | Hoenigschmid et al. |
| 2008/0043521 A1 | 2/2008 | Liaw et al. |
| 2008/0048164 A1 | 2/2008 | Odagawa |
| 2008/0083918 A1 | 4/2008 | Aratani et al. |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0165571 A1 | 7/2008 | Lung |
| 2008/0185567 A1 | 8/2008 | Kumar et al. |
| 2008/0192531 A1 | 8/2008 | Tamura et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |

(56) References Cited

U.S. PATENT DOCUMENTS

| | | |
|---|---|---|
| 2008/0278988 A1 | 11/2008 | Ufert |
| 2008/0278990 A1 | 11/2008 | Kumar et al. |
| 2008/0301497 A1 | 12/2008 | Chung et al. |
| 2008/0304312 A1 | 12/2008 | Ho et al. |
| 2008/0311722 A1 | 12/2008 | Petti et al. |
| 2009/0001343 A1 | 1/2009 | Schricker et al. |
| 2009/0001345 A1 | 1/2009 | Schricker et al. |
| 2009/0003717 A1 | 1/2009 | Sekiguchi et al. |
| 2009/0014703 A1 | 1/2009 | Inaba |
| 2009/0014707 A1 | 1/2009 | Lu et al. |
| 2009/0052226 A1 | 2/2009 | Lee et al. |
| 2009/0091981 A1 | 4/2009 | Park et al. |
| 2009/0095951 A1 | 4/2009 | Kostylev et al. |
| 2009/0109728 A1 | 4/2009 | Maejima et al. |
| 2009/0122591 A1* | 5/2009 | Ryu .................. G11C 7/02 365/148 |
| 2009/0134432 A1 | 5/2009 | Tabata et al. |
| 2009/0141567 A1 | 6/2009 | Lee et al. |
| 2009/0152737 A1 | 6/2009 | Harshfield |
| 2009/0168486 A1 | 7/2009 | Kumar |
| 2009/0227067 A1 | 9/2009 | Kumar et al. |
| 2009/0231905 A1 | 9/2009 | Sato |
| 2009/0231910 A1 | 9/2009 | Liu et al. |
| 2009/0250787 A1 | 10/2009 | Kutsunai |
| 2009/0251941 A1 | 10/2009 | Saito |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0268513 A1 | 10/2009 | De Ambroggi et al. |
| 2009/0272962 A1 | 11/2009 | Kumar et al. |
| 2009/0283737 A1 | 11/2009 | Kiyotoshi |
| 2009/0298224 A1 | 12/2009 | Lowrey |
| 2009/0321706 A1 | 12/2009 | Happ et al. |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0025675 A1 | 2/2010 | Yamazaki et al. |
| 2010/0032637 A1 | 2/2010 | Kinoshita et al. |
| 2010/0032638 A1 | 2/2010 | Xu |
| 2010/0032640 A1 | 2/2010 | Xu |
| 2010/0034518 A1 | 2/2010 | Iwamoto et al. |
| 2010/0038791 A1 | 2/2010 | Lee et al. |
| 2010/0039136 A1 | 2/2010 | Chua-Eoan et al. |
| 2010/0044708 A1 | 2/2010 | Lin et al. |
| 2010/0044798 A1 | 2/2010 | Hooker et al. |
| 2010/0046622 A1 | 2/2010 | Doser et al. |
| 2010/0067279 A1 | 3/2010 | Choi |
| 2010/0067282 A1 | 3/2010 | Liu et al. |
| 2010/0084625 A1 | 4/2010 | Wicker et al. |
| 2010/0085798 A1 | 4/2010 | Lu et al. |
| 2010/0085822 A1 | 4/2010 | Yan et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0110767 A1 | 5/2010 | Katoh et al. |
| 2010/0118587 A1 | 5/2010 | Chen et al. |
| 2010/0140614 A1 | 6/2010 | Uchiyama et al. |
| 2010/0157651 A1 | 6/2010 | Kumar et al. |
| 2010/0157656 A1 | 6/2010 | Tsuchida |
| 2010/0157659 A1 | 6/2010 | Norman |
| 2010/0157710 A1 | 6/2010 | Lambertson et al. |
| 2010/0163828 A1 | 7/2010 | Tu |
| 2010/0171086 A1 | 7/2010 | Lung et al. |
| 2010/0176367 A1 | 7/2010 | Liu |
| 2010/0176368 A1 | 7/2010 | Ko et al. |
| 2010/0182821 A1 | 7/2010 | Muraoka et al. |
| 2010/0203731 A1 | 8/2010 | Kong et al. |
| 2010/0219510 A1 | 9/2010 | Scheuerlein et al. |
| 2010/0221868 A1 | 9/2010 | Sandoval |
| 2010/0237314 A1 | 9/2010 | Tsukamoto et al. |
| 2010/0243983 A1 | 9/2010 | Chiang et al. |
| 2010/0258781 A1 | 10/2010 | Phatak et al. |
| 2010/0271885 A1 | 10/2010 | Scheuerlein et al. |
| 2010/0277969 A1 | 11/2010 | Li et al. |
| 2010/0321095 A1 | 12/2010 | Mikawa et al. |
| 2011/0006275 A1 | 1/2011 | Roelofs et al. |
| 2011/0007551 A1 | 1/2011 | Tian et al. |
| 2011/0033967 A1 | 2/2011 | Lutz et al. |
| 2011/0063888 A1 | 3/2011 | Chi et al. |
| 2011/0066878 A1 | 3/2011 | Hosono et al. |
| 2011/0068373 A1 | 3/2011 | Minemura et al. |
| 2011/0069533 A1 | 3/2011 | Kurosawa et al. |
| 2011/0089391 A1 | 4/2011 | Mihnea et al. |
| 2011/0122679 A1 | 5/2011 | Chen et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0151277 A1 | 6/2011 | Nishihara et al. |
| 2011/0155991 A1 | 6/2011 | Chen |
| 2011/0183525 A1 | 7/2011 | Purushothaman et al. |
| 2011/0193051 A1 | 8/2011 | Nam et al. |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0204314 A1 | 8/2011 | Baek et al. |
| 2011/0205780 A1 | 8/2011 | Yasuda et al. |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0310656 A1 | 12/2011 | Kreupl et al. |
| 2011/0312151 A1 | 12/2011 | Herner |
| 2011/0317470 A1 | 12/2011 | Lu et al. |
| 2012/0001145 A1 | 1/2012 | Magistretti et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0044751 A1 | 2/2012 | Wang et al. |
| 2012/0074374 A1 | 3/2012 | Jo |
| 2012/0074507 A1 | 3/2012 | Jo et al. |
| 2012/0076203 A1 | 3/2012 | Sugimoto et al. |
| 2012/0080798 A1 | 4/2012 | Harshfield |
| 2012/0087169 A1 | 4/2012 | Kuo et al. |
| 2012/0087172 A1* | 4/2012 | Aoki .................. G11C 13/0004 365/148 |
| 2012/0091420 A1 | 4/2012 | Kusai et al. |
| 2012/0104351 A1 | 5/2012 | Wei et al. |
| 2012/0108030 A1 | 5/2012 | Herner |
| 2012/0120712 A1 | 5/2012 | Kawai et al. |
| 2012/0122290 A1 | 5/2012 | Nagashima |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0147657 A1 | 6/2012 | Sekar et al. |
| 2012/0155146 A1 | 6/2012 | Ueda et al. |
| 2012/0176831 A1 | 7/2012 | Xiao et al. |
| 2012/0205606 A1 | 8/2012 | Lee et al. |
| 2012/0205793 A1 | 8/2012 | Schieffer et al. |
| 2012/0218807 A1 | 8/2012 | Johnson |
| 2012/0220100 A1 | 8/2012 | Herner |
| 2012/0224413 A1 | 9/2012 | Zhang et al. |
| 2012/0235112 A1 | 9/2012 | Huo et al. |
| 2012/0236625 A1 | 9/2012 | Ohba et al. |
| 2012/0241710 A1 | 9/2012 | Liu et al. |
| 2012/0243292 A1 | 9/2012 | Takashima et al. |
| 2012/0250183 A1 | 10/2012 | Tamaoka et al. |
| 2012/0252183 A1 | 10/2012 | Herner |
| 2012/0269275 A1 | 10/2012 | Hannuksela |
| 2012/0305874 A1 | 12/2012 | Herner |
| 2012/0305879 A1 | 12/2012 | Lu et al. |
| 2012/0320660 A1 | 12/2012 | Nazarian et al. |

(56) References Cited

U.S. PATENT DOCUMENTS

| | | |
|---|---|---|
| 2012/0326265 A1 | 12/2012 | Lai et al. |
| 2012/0327701 A1* | 12/2012 | Nazarian ............ G11C 11/5678 365/148 |
| 2013/0020548 A1 | 1/2013 | Clark et al. |
| 2013/0023085 A1 | 1/2013 | Pramanik et al. |
| 2013/0026440 A1 | 1/2013 | Yang et al. |
| 2013/0065066 A1 | 3/2013 | Sambasivan et al. |
| 2013/0075685 A1 | 3/2013 | Li et al. |
| 2013/0075688 A1 | 3/2013 | Xu et al. |
| 2013/0119341 A1 | 5/2013 | Liu et al. |
| 2013/0128653 A1 | 5/2013 | Kang et al. |
| 2013/0134379 A1 | 5/2013 | Lu |
| 2013/0166825 A1 | 6/2013 | Kim et al. |
| 2013/0207065 A1 | 8/2013 | Chiang |
| 2013/0214234 A1 | 8/2013 | Gopalan et al. |
| 2013/0235648 A1 | 9/2013 | Kim et al. |
| 2013/0264535 A1 | 10/2013 | Sonehara |
| 2013/0279240 A1 | 10/2013 | Jo |
| 2013/0308369 A1 | 11/2013 | Lu et al. |
| 2014/0015018 A1 | 1/2014 | Kim |
| 2014/0029327 A1 | 1/2014 | Strachan et al. |
| 2014/0070160 A1 | 3/2014 | Ishikawa et al. |
| 2014/0103284 A1 | 4/2014 | Hsueh et al. |
| 2014/0145135 A1 | 5/2014 | Gee et al. |
| 2014/0166961 A1 | 6/2014 | Liao et al. |
| 2014/0175360 A1 | 6/2014 | Tendulkar et al. |
| 2014/0177315 A1 | 6/2014 | Pramanik et al. |
| 2014/0192589 A1 | 7/2014 | Maxwell et al. |
| 2014/0197369 A1 | 7/2014 | Sheng et al. |
| 2014/0233294 A1* | 8/2014 | Ting .................. G11C 7/02 365/66 |
| 2014/0264236 A1 | 9/2014 | Kim et al. |
| 2014/0264250 A1 | 9/2014 | Maxwell et al. |
| 2014/0268997 A1 | 9/2014 | Nazarian et al. |
| 2014/0268998 A1 | 9/2014 | Jo |
| 2014/0269002 A1 | 9/2014 | Jo |
| 2014/0312296 A1 | 10/2014 | Jo et al. |
| 2014/0335675 A1 | 11/2014 | Narayanan |
| 2015/0070961 A1* | 3/2015 | Katayama ........... G11C 11/1659 365/66 |
| 2015/0228334 A1* | 8/2015 | Nazarian ............. G11C 13/004 365/72 |
| 2016/0111640 A1 | 4/2016 | Chang et al. |

FOREIGN PATENT DOCUMENTS

| | | |
|---|---|---|
| CN | 101501850 A | 8/2009 |
| CN | 101636792 A | 1/2010 |
| CN | 102024494 A | 4/2011 |
| CN | 102077296 A | 5/2011 |
| EP | 1096465 A2 | 5/2001 |
| EP | 2405441 A1 | 1/2012 |
| EP | 2408035 A2 | 1/2012 |
| JP | 2005506703 A | 3/2005 |
| JP | 2006032951 A | 2/2006 |
| JP | 2007067408 A | 3/2007 |
| JP | 2007281208 A | 10/2007 |
| JP | 2007328857 A | 12/2007 |
| JP | 2008503085 A | 1/2008 |
| JP | 2008147343 A | 6/2008 |
| JP | 2009043873 A | 2/2009 |
| JP | 2011023645 A | 2/2011 |
| JP | 2011065737 A | 3/2011 |
| JP | 2012504840 A | 2/2012 |
| JP | 2012505551 A | 3/2012 |
| JP | 2012089567 A | 5/2012 |
| JP | 2012533195 A | 12/2012 |
| KR | 20090051206 A | 5/2009 |
| KR | 20110014248 A | 2/2011 |
| WO | 03034498 A1 | 4/2003 |
| WO | 2005124787 A2 | 12/2005 |
| WO | 2009005699 A1 | 1/2009 |
| WO | 2010026654 A1 | 3/2010 |
| WO | 2010042354 A1 | 4/2010 |
| WO | 2010042732 A2 | 4/2010 |
| WO | 2011005266 A1 | 1/2011 |
| WO | 2011008654 A1 | 1/2011 |
| WO | 2011133138 A1 | 10/2011 |

OTHER PUBLICATIONS

Office Action dated May 6, 2012 for U.S. Appl. No. 12/815,318, 26 pages.
Office Action dated Jul. 30, 2012 for U.S. Appl. No. 12/900,232, 14 pages.
Office Action dated Aug. 9, 2013 for U.S. Appl. No. 13/764,710, 16 pages.
International Search Report and Written Opinion for Application No. PCT/US2012/044077, mailed on Jan. 25, 2013, 9 pages.
International Search Report and Written Opinion for Application No. PCT/US2012/045312, mailed on Mar. 29, 2013, 11 pages.
International Search Report and Written Opinion for Application No. PCT/US2013/054976, mailed on Dec. 16, 2013, 9 pages.
International Search Report and Written Opinion for Application No. PCT/US2013/061244, mailed on Jan. 28, 2014, 8 pages.
International Search Report and Written Opinion for Application No. PCT/US2013/077628, mailed on Apr. 29, 2014, 12 pages.
International Search Report for Application No. PCT/US2009/060023, mailed on May 18, 2010, 3 pages.
International Search Report for Application No. PCT/US2009/061249, mailed on May 19, 2010, 3 pages.
International Search Report for Application No. PCT/US2011/040090, mailed on Feb. 17, 2012, 5 pages.
International Search Report for Application No. PCT/US2011/045124, mailed on May 29, 2012, 3 pages.
International Search Report for Application No. PCT/US2011/046036, mailed on Feb. 23, 2012, 3 pages.
Jafar M., et al., "Switching in Amorphous-silicon Devices," Physical Review, 1994, vol. 49 (19), pp. 611-615.
Japanese Office Action and English Translation for Japanese Patent Application No. 2011-153349 mailed Feb. 24, 2015, 9 pages.
Japanese Office Action and English Translation for Japanese Patent Application No. 2011-153349 mailed Mar. 24, 2015, 9 pages.
Japanese Office Action (English Translation) for Japanese Application No. 2011-153349 mailed Feb. 24, 2015, 3 pages.
Japanese Office Action (English Translation) for Japanese Application No. 2013-525926 mailed Mar. 3, 2015, 4 pages.
Japanese Office Action (English Translation) for Japanese Application No. 2014-513700 mailed Jan. 12, 2016, 4 pages.
Japanese Search Report (English Translation) for Japanese Application No. 2013-525926 dated Feb. 9, 2015, 15 pages.
Japanese Search Report (English Translation) for Japanese Application No. 2011-153349 dated Feb. 9, 2015, 11 pages.
Japanese Search Report (English Translation) for Japanese Application No. 2014-513700 dated Jan. 14, 2016, 25 pages.
Jian Hu., et al., "Area-Dependent Switching in Thin Film-Silicon Devices," Materials Research Society Symposium Proceedings, 2003, vol. 762, pp. A 18.3.1-A 18.3.6.
Jian Hu., et al., "Switching and Filament Formation in hot-wire CVD p-type a-Si:H devices," Thin Solid Films, Science Direct, 2003, vol. 430, pp. 249-252.
Jo S.H., et al., "A Silicon-Based Crossbar Ultra-High-Density Non-Volatile Memory", SSEL Annual Report, 2007.
Jo S.H., et al., "Ag/a-Si:H/c-Si Resistive Switching Nonvolatile Memory Devices," Nanotechnology Materials and Devices Conference, 2006, vol. 1, pp. 116-117.
Jo S.H., et al., "CMOS Compatible Nanoscale Nonvolatile Resistance Switching Memory," Nano Letters, 2008, vol. 8 (2), pp. 392-397.
Jo S.H., et al., "Experimental, Modeling and Simulation Studies of Nanoscale Resistance Switching Devices", 9.sup.th Conference on Nanotechnology, IEEE, 2009, pp. 493-495.
Jo S.H., et al., "High-Density Crossbar Arrays Based on a Si Memristive System," Nano Letters, 2009, vol. 9 (2), pp. 370-874.
Jo S.H. et al., "High-Density Crossbar Arrays Based on a Si Memristive System", Supporting Information, 2009, pp. 1-4.

(56) References Cited

OTHER PUBLICATIONS

Jo S.H., et al., "Si Memristive Devices Applied to Memory and Neuromorphic Circuits", Proceedings of 2010 IEEE International Symposium on Circuits and Systems, 2010, pp. 13-16.
Jo S.H., et al., "Si-Based Two-Terminal Resistive Switching Nonvolatile Memory", IEEE, 2008.
Jo S. H., et al., "Nanoscale Memristive Devices for Memory and Logic Applications", Ph. D Dissertation, University of Michigan, 2010.
Jo S.H., et al., "Nanoscale Memristor Device as Synapse in Neuromorphic Systems," Nano Letters, 2010, vol. 10, pp. 1297-1301.
Jo S.H., et al., "Nonvolatile Resistive Switching Devices Based on Nanoscale Metal/Amorphous Silicon/Crystalline Silicon Junctions," Materials Research Society Symposium Proceedings, 2007, vol. 997.
Jo S.H., et al., "Programmable Resistance Switching in Nanoscale Two-Terminal Devices," Nano Letters, 2009, vol. 9 (1), pp. 496-500.
Jo S.H., et al., "Programmable Resistance Switching in Nanoscale Two-Terminal Devices," Supporting Information, 2009, pp. 1-4.
Kuk-Hwan Kim et al., "Nanoscale Resistive Memory with Intrinsic Diode Characteristics and Long Endurance," Applied Physics Letters, 2010, vol. 96, pp. 053106-1-053106-3.
Kund M., et al., "Conductive Bridging Ram (cbram): An Emerging Non-volatile Memory Technology Scalable to Sub 20nm", IEEE, 2005.
Le Comber P.G., et al., "The Switching Mechanism in Amorphous Silicon Junctions," Journal of Non-Crystalline Solids, 1985, vol. 77 & 78, pp. 1373-1382.
Le Comber P.G., "Present and Future Applications of Amorphous Silicon and Its Alloys," Journal of Non-Crystalline Solids, 1989, vol. 115, pp. 1-13.
Lee S.H., et al., "Full Integration and Cell Characteristics for 64Mb Nonvolatile PRAM", 2004 Symposium on VLSI Technology Digest of Technical Papers, IEEE, 2004, pp. 20-21.
Liu M., et al., "rFGA: CMOS-Nano Hybrid FPGA Using RRAM Components", IEEE CB3 N17 International Symposium on Nanoscale Architectures, Anaheim, USA, Jun. 12-13, 2008, pp. 93-98.
Lu W., et al., "Nanoelectronics from the Bottom Up," Nature Materials, 2007, vol. 6, pp. 841-850.
Lu W., et al., "Supporting Information", 2008.
Marand H., et al., MESc. 5025 lecture notes: Chapter 7. Diffusion, University of Vermont. Retrieved from the Internet. http://www.files.chem.vt.edu/chem-dept/marand/MEScchap6-1c.pdf.
Moopenn k et al., "Programmable Synaptic Devices for Electronic Neural Nets," Control and Computers, 1990, vol. 18 (2), pp. 37-41.
Muller D.A., et al., "The Electronic Structure at the Atomic Scale of Ultrathin Gate Oxides," Nature, 1999, vol. 399, pp. 758-761.
Muller G., et al., "Status and Outlook of Emerging Nonvolatile Memory Technologies", IEEE, 2004, pp. 567-570.
Newman R.C., "Defects in Silicon," Reports on Progress in Physics, 1982, vol. 45, pp. 1163-1210.
Notice of Allowance dated Nov. 26, 2013 for U.S. Appl. No. 13/481,696, 15 pages.
Notice of Allowance dated Dec. 16, 2014 for U.S. Appl. No. 12/835,704, 47 pages.
Notice of Allowance dated Dec. 19, 2014 for U.S. Appl. No. 13/529,985, 9 pgs.
Written Opinion for Application No. PCT/US2011/045124, mailed on May 29, 2012, 5 pages.
Written Opinion for Application No. PCT/US2011/046036, mailed on Feb. 23, 2012, 4 pages.
Yin S., "Solution Processed Silver Sulfide Thin Films for Filament Memory Applications", Technical Report No. UCB/EECS-2010-166, Dec. 17, 2010, Electrical Engineering and Computer Sciences, University of California at Berkeley. Retrieved from the Internet.
Yuan H.C., et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Ankovych S., et al., "Nanoimprint Lithography: Challenges and Prospects," Nanotechnology, 2001, vol. 12, pp. 91-95.
Notice of Allowance dated Jul. 1, 2016 for U.S. Appl. No. 14/213,953, 96 pages.
Notice of Allowance dated Jul. 17, 2014 for U.S. Appl. No. 12/861,432, 25 pages.
Notice of Allowance for U.S. Appl. No. 14/213,953 dated Feb. 16, 2016, 21 pages.
Notice of Allowance for U.S. Appl. No. 14/611,022 dated Feb. 12, 2016, 13 pages.
Notice of Allowance for U.S. Appl. No. 14/611,022 dated Jun. 8, 2016, 57 pages.
Notice of Allowance for U.S. Appl. No. 14/611,022 dated Sep. 10, 2015, 13 pages.
Notice of Allowance for U.S. Appl. No. 14/612,025 dated Jul. 22, 2015, 25 pages.
Notice of Allowance for U.S Appl. No. 14/509,967 dated Feb. 17, 2016, 18 pages.
Notice of Allowance for U.S Appl. No. 14/509,967 dated Jun. 16, 2016, 96 pages.
Notice of Allowance for U.S. Appl. No. 13/912,136 dated Aug. 3, 2015, 15 pages.
Notice of Allowance for U.S. Appl. No. 13/952,467 dated May 20, 2016, 19 pages.
Notice of Allowance for U.S. Appl. No. 14/027,045 dated Jun. 9, 2015, 14 pages.
Notice of Allowance for U.S. Appl. No. 14/588,202 dated Jan. 20, 2016, 15 pages.
Notice of Allowance for U.S. Appl. No. 14/887,050 dated Jun. 22, 2016, 13 pages.
Notice of Allowance for U.S. Appl. No. 14/946,367 dated Jul. 13, 2016, 23 pages.
Notice of Allowance mailed Sep. 4, 2014 for U.S. Appl. No. 13/761,132, filed Feb. 6, 2013.
Notice of Allowance mailed Oct. 5, 2011 for U.S. Appl. No. 12/940,920, filed Nov. 5, 2010.
Notice of Allowance mailed Feb. 6, 2012 for U.S. Appl. No. 12/835,699, filed Jul. 13, 2010.
Notice of Allowance mailed Feb. 6, 2013 for U.S. Appl. No. 13/118,258, filed May 27, 2011.
Notice of Allowance mailed Aug. 8, 2013 for U.S. Appl. No. 13/733,828, filed Jan. 3, 2013.
Notice of Allowance mailed Jan. 8, 2013 for U.S. Appl. No. 12/814,410, filed Jun. 11, 2010.
Notice of Allowance mailed Oct. 8, 2013 for U.S. Appl. No. 13/769,152, filed Feb. 15, 2013.
Notice of Allowance mailed Oct. 8, 2013 for U.S. Appl. No. 13/905,074, filed May 29, 2013.
Notice of Allowance mailed Apr. 9, 2013 for U.S. Appl. No. 13/748,490, filed Jan. 23, 2013.
Notice of Allowance mailed Sep. 9, 2014 for U.S. Appl. No. 13/620,012, filed Sep. 14, 2012.
Notice of Allowance mailed Sep. 9, 2014 for U.S. Appl. No. 13/870,919, filed Apr. 25, 2013.
Notice of Allowance mailed Oct. 10, 2013 for U.S. Appl. No. 13/452,657, filed Apr. 20, 2012.
Notice of Allowance mailed Jan. 11, 2013 for U.S. Appl. No. 12/894,087, filed Sep. 29, 2010.
Notice of Allowance mailed May 11, 2012 for U.S. Appl. No. 12/939,824, filed Nov. 4, 2010.
Notice of Allowance mailed Jan. 11, 2016 for U.S. Appl. No. 14/613,299.
Notice of Allowance mailed Mar. 12, 2012 for U.S. Appl. No. 12/913,719, filed Oct. 27, 2010.
Notice of Allowance mailed Jan. 20, 2016 for U.S. Appl. No. 14/034,390.
Notice of Allowance mailed Nov. 13, 2013 for U.S. Appl. No. 13/461,725, filed May 1, 2012.
Notice of Allowance mailed Nov. 14, 2012 for U.S. Appl. No. 12/861,666, filed Aug. 23, 2010.

(56) References Cited

OTHER PUBLICATIONS

Notice of Allowance mailed Nov. 14, 2012 for U.S. Appl. No. 13/532,019, filed Jun. 25, 2012.
Notice of Allowance mailed Mar. 15, 2013 for U.S. Appl. No. 12/894,098, filed Sep. 29, 2010.
Notice of Allowance mailed Jan. 16, 2014 for U.S. Appl. No. 13/921,157, filed Jun. 18, 2013.
Notice of Allowance mailed Oct. 16, 2013 for U.S. Appl. No. 13/174,264, filed Jun. 30, 2011.
Notice of Allowance mailed Apr. 17, 2012 for U.S. Appl. No. 13/158,231, filed Jun. 10, 2011.
Notice of Allowance mailed Jan. 17, 2014 for U.S. Appl. No. 13/725,331, filed Dec. 21, 2012.
Notice of Allowance mailed Mar. 17, 2014 for U.S. Appl. No. 13/592,224, filed Aug. 22, 2012.
Notice of Allowance mailed May 17, 2013 for U.S. Appl. No. 13/290,024.
Notice of Allowance mailed Sep. 17, 2013 for U.S. Appl. No. 13/679,976, filed Nov. 16, 2012.
Notice of Allowance mailed Sep. 17, 2014 for U.S. Appl. No. 13/960,735, filed Aug. 6, 2013.
Notice of Allowance mailed Sep. 17, 2014 for U.S. Appl. No. 13/462,653, filed May 2, 2012.
Notice of Allowance mailed Sep. 18, 2012 for U.S. Appl. No. 12/900,232, filed Oct. 7, 2010.
Notice of Allowance mailed Sep. 18, 2014 for U.S. Appl. No. 13/920,021, filed Jun. 17, 2013.
Notice of Allowance mailed Sep. 18, 2014 for U.S. Appl. No. 13/586,815, filed Aug. 15, 2012.
Notice of Allowance mailed Jun. 19, 2012 for U.S Appl. No. 12/861,650, filed Aug. 23, 2010.
Notice of Allowance mailed Sep. 19, 2013 for U.S. Appl. No. 13/585,759, filed Aug. 14, 2012.
Notice of Allowance mailed Apr. 2, 2013 for U.S. Appl. No. 13/149,757, filed May 31, 2011.
Notice of Allowance mailed Feb. 20, 2014 for U.S. Appl. No. 13/468,201, filed May 10, 2012.
Notice of Allowance mailed Mar. 20, 2014 for U.S. Appl. No. 13/598,550, filed Aug. 29, 2012.
Notice of Allowance mailed Mar. 20, 2014 for U.S. Appl. No. 13/461,725, filed May 1, 2012.
Notice of Allowance mailed Oct. 21, 2011 for U.S. Appl. No. 12/582,086, filed Oct. 20, 2009.
Notice of Allowance mailed Oct. 21, 2014 for U.S. Appl. No. 13/426,869, filed Mar. 22, 2012.
Notice of Allowance mailed Feb. 10, 2015 for U.S. Appl. No. 13/525,096, filed Jun. 15, 2012.
Notice of Allowance mailed May 22, 2012 for U.S. Appl. No. 12/815,369, filed Jun. 14, 2010.
Notice of Allowance mailed Dec. 23, 2015 for U.S. Appl. No. 14/573,770.
Notice of Allowance mailed Oct. 23, 2013 for U.S. Appl. No. 13/417,135, filed Mar. 9, 2012.
Notice of Allowance mailed Jan. 24, 2013 for U.S. Appl. No. 13/314,513, filed Dec. 8, 2011.
Notice of Allowance mailed Jul. 24, 2012 for U.S. Appl. No. 12/939,824, filed Nov. 4, 2010.
Notice of Allowance mailed Oct. 25, 2012 for U.S. Appl. No. 12/894,087, filed Sep. 29, 2010.
Notice of Allowance mailed Sep. 25, 2014 for U.S. Appl. No. 13/447,036, filed Apr. 13, 2012.
Notice of Allowance mailed Sep. 26, 2014 for U.S. Appl. No. 13/594,665, filed Aug. 24, 2012.
Notice of Allowance mailed Aug. 27, 2014 for U.S. Appl. No. 13/077,941, filed Mar. 31, 2011.
Notice of Allowance mailed Nov. 28, 2012 for U.S. Appl. No. 13/290,024, filed Nov. 4, 2011.
Notice of Allowance mailed Oct. 28, 2013 for U.S. Appl. No. 13/194,500, filed Jul. 29, 2011.
Notice of Allowance mailed Oct. 28, 2013 for U.S. Appl. No. 13/651,169, filed Oct. 12, 2012.
Notice of Allowance mailed Nov. 29, 2012 for U.S. Appl. No. 12/815,318, filed Jun. 14, 2010.
Notice of Allowance mailed Oct. 29, 2012 for U.S. Appl. No. 13/149,807, filed May 31, 2011.
Notice of Allowance mailed May 30, 2012 for U.S. Appl. No. 12/833,898, filed Jul. 9, 2010.
Notice of Allowance mailed Sep. 30, 2013 for U.S. Appl. No. 13/481,696, filed May 25, 2012.
Notice of Allowance mailed Aug. 31, 2012 for U.S. Appl. No. 13/051,296, filed Mar. 18, 2011.
Notice of Allowance mailed Apr. 20, 2016 for U.S. Appl. No. 14/573,817.
Notice of Allowance mailed Oct. 8, 2014 for U.S. Appl. No. 13/077,941, filed Mar. 31, 2011.
Notice of Allowance mailed Aug. 26, 2015 for U.S. Appl. No. 14/034,390.
Notice of Allowance mailed Sep. 8, 2015 for U.S. Appl. No. 14/613,299.
Office Action dated Dec. 31, 2015 for U.S. Appl. No. 14/692,677, 27 pages.
Office Action dated Feb. 5, 2015 for U.S. Appl. No. 14/027,045, 6 pages.
Office Action dated Apr. 11, 2014 for U.S. Appl. No. 13/594,665, 44 pages.
Office Action dated Apr. 6, 2015 for U.S. Appl. No. 13/912,136, 23 pages.
Office Action for European Application No. 11005649.6 dated Dec. 1, 2014, 2 pages.
Office Action for European Application No. 11005649.6 dated Nov. 17, 2015, 5 pages.
Office Action for European Application No. EP11005207.3 dated Aug. 8, 2012, 4 pages.
Office Action for U.S. Appl. No. 13/463,714 dated Dec. 7, 2012.
Office Action for U.S. Appl. No. 14/611,022 dated May 7, 2015, 13 pages.
Office Action for U.S. Appl. No. 14/612,025 dated Feb. 1, 2016, 12 pages.
Office Action for U.S. Appl. No. 13/952,467 dated Jan. 15, 2016, 22 pages.
Office Action for U.S. Appl. No. 14/194,499 dated May 18, 2016, 10 pages.
Office Action for U.S. Appl. No. 14/207,430 dated Oct. 15, 2015, 57 pages.
Office Action for U.S. Appl. No. 14/207,430 dated Mar. 10, 2016, 78 pages.
Office Action for U.S. Appl. No. 14/207,430 dated Jul. 25, 2016, 79 pages.
Office Action for U.S. Appl. No. 14/213,953 dated Nov. 9, 2015, 20 pages.
Office Action for U.S. Appl. No. 14/588,202 dated May 10, 2016, 8 pages.
Office Action for U.S. Appl. No. 14/588,202 dated Sep. 11, 2015, 9 pages.
Office Action for U.S. Appl. No. 14/613,301 dated Feb. 4, 2016, 42 pages.
Office Action for U.S. Appl. No. 14/613,301 dated Mar. 31, 2015, 58 pages.
Office Action for U.S Appl. No. 14/613,301 dated Jul. 31, 2015, 26 pages.
Office Action for U.S. Appl. No. 14/887,050 dated Mar. 11, 2016, 12 pages.
Office Action for U.S. Appl. No. 15/046,172 dated Apr. 20, 2016, 8 pages.
Office Action mailed Apr. 1, 2013 for U.S. Appl. No. 13/174,077, filed Jun. 30, 2011.
Office Action mailed Aug. 1, 2012 for U.S. Appl. No. 12/894,098, filed Sep. 29, 2010.
Office Action mailed Mar. 1, 2012 for U.S. Appl. No. 12/835,704, filed Jul. 13, 2010.
Office Action mailed Aug. 2, 2013 for U.S. Appl. No. 13/594,665 filed Aug. 24, 2012.

(56) References Cited

OTHER PUBLICATIONS

Office Action mailed Sep. 2, 2014 for U.S. Appl. No. 13/705,082, 41 pages.
Office Action mailed Apr. 3, 2014 for U.S. Appl. No. 13/870,919, filed Apr. 25, 2013.
Office Action mailed Oct. 3, 2013 for U.S. Appl. No. 131921,157, filed Jun. 18, 2013.
Office Action mailed Apr. 5, 2012 for U.S. Appl. No. 12/833,898, filed Jul. 9, 2010.
Office Action mailed Oct. 5, 2011 for U.S. Appl. No. 11/875,541, filed Oct. 19, 2007.
Office Action mailed Apr. 6, 2015 for U.S. Appl. No. 14/034,390, filed Sep. 23, 2013.
Office Action mailed Dec. 6, 2013 for U.S Appl. No. 13/564,639, filed Aug. 1, 2012.
Office Action mailed Dec. 6, 2013 for U.S. Appl. No. 131960,735, filed Aug. 6, 2013.
Office Action mailed Feb. 6, 2014 for U.S. Appl. No. 13/434,567, filed Mar. 29, 2012.
Office Action mailed Mar. 3, 2013 for U.S. Appl. No. 13/174,264, filed Jun. 30, 2011.
Office Action mailed Mar. 6, 2013 for U.S. Appl. No. 13/679,976, filed Nov. 16, 2012.
Office Action mailed Sep. 6, 2011 for U.S. Appl. No. 12/582,086, filed Oct. 20, 2009.
Office Action mailed Dec. 7, 2012 for U.S Appl. No. 13/436,714, filed Mar. 30, 2012.
Office Action mailed Mar. 7, 2013 for U.S. Appl. No. 13/651,169 filed Oct. 12, 2012.
Office Action mailed May 7, 2013 for U.S. Appl. No. 13/585,759, filed Aug. 14, 2012.
Office Action mailed Aug. 8, 2012 for EP Application No. EP11005207 filed Jun. 27, 2011.
Office Action mailed Jan. 8, 2014 for U.S. Appl. No. 12/861,432, filed Aug. 23, 2010.
Office Action mailed Jun. 8, 2012 for U.S. Appl. No. 11/875,541, filed 19 Oct. 19, 2007.
Office Action mailed Jul. 9, 2013 for U.S. Appl. No. 13/447,036, filed Apr. 13, 2012.
Office Action mailed Jul. 9, 2014 for U.S. Appl. No. 14/166,691, filed Jan. 28, 2014.
Office Action mailed Oct. 9, 2012 for U.S. Appl. No. 13/417,135, filed Mar. 9, 2012.
Office Action mailed Jan. 10, 2014 for U.S. Appl. No. 13/920,021, filed Jun. 17, 2013.
Office Action mailed Apr. 11, 2014 for U.S. Appl. No. 13/143,047, filed Jun. 30, 2011.
Office Action mailed Feb. 11, 2014 for U.S. Appl. No. 13/620,012, filed Sep. 14, 2012.
Office Action mailed Jul. 11, 2013 for U.S. Appl. No. 13/764,698, filed Feb. 11, 2013.
Office Action mailed Sep. 11, 2014 for U.S. Appl. No. 13/739,283, filed Jan. 11, 2013.
Office Action mailed Aug. 12, 2013 for U.S. Appl. No. 13/077,941, filed Mar. 31, 2011.
Office Action mailed Mar. 12, 2014 for U.S. Appl. No. 13/167,920, filed Jun. 24, 2011.
Office Action mailed Sep. 12, 2014 for U.S. Appl. No. 13/426,869, filed Mar. 22, 2012.
Office Action mailed Sep. 12, 2014 for U.S. Appl. No. 13/756,498.
Office Action mailed Dec. 3, 2015 for U.S. Appl. No. 14/253,796.
Office Action mailed Feb. 13, 2014 for U.S. Appl. No. 13/174,077, filed Jun. 30, 2011.
Office Action mailed Mar. 14, 2012 for U.S. Appl. No. 12/815,369, filed Jun. 14, 2010.
Office Action mailed Mar. 14, 2014 for U.S. Appl. No. 12/835,704, filed Jul. 13, 2010.
Office Action mailed Apr. 15, 2016 for U.S. Appl. No. 14/597,151.
Office Action mailed Apr. 16, 2012 for U.S. Appl. No. 12/834,610, filed Jul. 12, 2010.
Office Action mailed Jan. 16, 2014 for U.S. Appl. No. 13/739,283, filed Jan. 11, 2013.
Office Action mailed Oct. 16, 2012 for U.S. Appl. No. 12/861,650, filed Aug. 23, 2010.
Office Action mailed Apr. 17, 2012 for U.S. Appl. No. 12/814,410, filed Jun. 11, 2010.
Office Action mailed Feb. 17, 2011 for U.S. Appl. No. 12/913,719, filed Oct. 27, 2010.
Office Action mailed Jun. 17, 2014 for U.S. Appl. No. 14/072,657, filed Nov. 5, 2013.
Office Action mailed Mar. 17, 2015 for U.S. Appl. No. 14/573,770.
Office Action mailed Apr. 18, 2016 for U.S. Appl. No. 14/573,770.
Office Action mailed Apr. 19, 2011 for U.S. Appl. No. 12/582,086, filed Oct. 20, 2009.
Office Action mailed Aug. 19, 2013 for U.S. Appl. No. 13/585,759, filed Aug. 14, 2012.
Office Action mailed Jun. 19, 2012 for U.S. Appl. No. 13/149,757, filed May 31, 2011.
Office Action mailed Mar. 19, 2013 for U.S. Appl. No. 13/465,188, filed May 7, 2012.
Office Action mailed Mar. 19, 2013 for U.S. Appl. No. 13/564,639, filed Aug. 1, 2012.
Office Action mailed May 20, 2013 for U.S. Appl. No. 13/725,331, filed Dec. 21, 2012.
Office Action mailed Nov. 20, 2012 for U.S. Appl. No. 13/149,653, filed May 31, 2011.
Office Action mailed Sep. 20, 2013 for U.S. Appl. No. 13/481,600, filed May 25, 2012.
Office Action mailed Mar. 21, 2014 for U.S. Appl. No. 13/447,036 filed Apr. 13, 2012.
Office Action mailed May 21, 2014 for U.S. Appl. No. 13/764,698, filed Feb. 11, 2013.
Office Action mailed Sep. 21, 2011 for U.S. Appl. No. 12/835,704, filed Jul. 13, 2010.
Office Action mailed Jul. 22, 2010 for U.S. Appl. No. 11/875,541, filed Oct. 19, 2007.
Office Action mailed Jul. 22, 2011 for U.S. Appl. No. 12/913,719, filed Oct. 27, 2010.
Office Action mailed Sep. 22, 2013 for U.S. Appl. No. 13/189,401, filed Jul. 22, 2011.
Office Action mailed May 23, 2013 for U.S. Appl. No. 13/592,224, filed Aug. 22, 2012.
Office Action mailed Aug. 24, 2011 for U.S. Appl. No. 12/835,699, filed Jul. 13, 2010.
Office Action mailed Apr. 25, 2012 for U.S. Appl. No. 13/149,653, filed May 31, 2011.
Office Action mailed Apr. 25, 2014 for U.S. Appl. No. 13/761,132, filed Feb. 6, 2013.
Office Action mailed Jan. 25, 2012 for U.S. Appl. No. 12/861,650, filed Aug. 23, 2010.
Office Action mailed Oct. 25, 2012 for U.S. Appl. No. 13/461,725, filed May 1, 2012.
Office Action mailed Sep. 25, 2013 for U.S. Appl. No. 13/194,479, filed Jul. 29, 2011.
Office Action mailed Nov. 26, 2012 for U.S Appl. No. 13/156,232.
Office Action mailed Aug. 27, 2013 for U.S. Appl. No. 13/436,714, filed Mar. 30, 2012.
Office Action mailed Dec. 27, 2013 for U.S Appl. No. 13/525,096, filed Jun. 15, 2012.
Office Action mailed Mar. 27, 2012 for U.S. Appl. No. 13/314,513, filed Dec. 8, 2011.
Office Action mailed Feb. 28, 2014 for U.S. Appl. No. 12/625,817, filed Nov. 25, 2009.
Office Action mailed Jan. 29, 2014 for U.S. Appl. No. 13/586,815, filed Aug. 15, 2012.
Office Action mailed Jul. 29, 2013 for U.S. Appl. No. 13/466,008, filed May 7, 2012.
Office Action mailed Mar. 29, 2013 for U.S. Appl. No. 12/861,432, filed Aug. 23, 2010.
Office Action mailed Jun. 30, 2014 for U.S. Appl. No. 13/531,449, filed Jun. 22, 2012.
Office Action mailed Mar. 30, 2011 for U.S. Appl. No. 11/875,541, filed Oct. 19, 2007.

(56) References Cited

OTHER PUBLICATIONS

Office Action mailed Sep. 30, 2013 for U.S. Appl. No. 13/189,401, filed Jul. 22, 2011.
Office Action mailed Sep. 30, 2013 for U.S. Appl. No. 13/462,653, filed May 2, 2012.
Office Action mailed Apr. 6, 2015 for U.S. Appl. No. 14/034,390.
Office Action mailed May 20, 2016 for U.S. Appl. No. 14/613,299.
Office Action mailed Jul. 9, 2015 for U.S. Appl. No. 14/573,817.
Owen A.E., et al., "Electronic Switching in Amorphous Silicon Devices: Properties of the Conducting Filament", Proceedings of 5th International Conference on Solid-State and Integrated Circuit Technology, IEEE, 1998, pp. 330-833.
Owen A.E., et al., "Memory Switching in Amorphous Silicon Devices," Journal of Non- Crystalline Solids, 1983, vol. 50-60 (Pt.2), pp. 1273-1280.
Owen A.E., et al., "New Amorphous-Silicon Electrically Programmable Nonvolatile Switching Device," Solid-State and Electron Devices, IEEE Proceedings, 1982, vol. 129 (Pt 1), pp. 51-54.
Owen A.E., et al., "Switching in Amorphous Devices," International Journal of Electronics, 1992, vol. 73 (5), pp. 897-906.
Rose M.J., et al., "Amorphous Silicon Analogue Memory Devices," Journal of Non-Crystalline Solids, 1989, vol. 115, pp. 168-170.
Russo U., et al., "Self-Accelerated Thermal Dissolution Model for Reset Programming in Unipolar Resistive-Switching Memory (RRAM) Devices," IEEE Transactions on Electron Devices, 2009, vol. 56 (2), pp. 193-200.
Scott J.C., "Is There an Immortal Memory?," American Association for the Advancement of Science, 2004, vol. 304 (5667), pp. 62-63.
Shin W., et al., "Effect of Native Oxide on Polycrystalline Silicon CMP," Journal of the Korean Physical Society, 2009, vol. 54 (3), pp. 1077-1081.
Stikeman A., Polymer Memory—The Plastic Path to Better Data Storage, Technology Review, Sep. 2002, pp. 31 Retrieved from the Internet.
Suehle J.S., et al., "Temperature Dependence of Soft Breakdown and Wear-out in Sub-3 Nm Si02 Films", 38th Annual International Reliability Physics Symposium, San Jose, California, 2000, pp. 33-39.
Sune J., et al., "Nondestructive Multiple Breakdown Events in Very Thin Si02 Films," Applied Physics Letters, 1989, vol. 55, pp. 128-130.
Terabe K., et al., "Quantized Conductance Atomic Switch," Nature, 2005, vol. 433, pp. 47-50.
Waser R., et al., "Nanoionics-based Resistive Switching Memories," Nature Materials, 2007, vol. 6, pp. 833-835.
Written Opinion for Application No. PCT/US2009/060023, mailed on May 18, 2010, 3 pages.
Written Opinion for Application No. PCT/US2009/061249, mailed on May 19, 2010, 3 pages.
Written Opinion for Application No. PCT/US2011/040090, mailed on Feb. 17, 2012, 6 pages.
Advisory Action mailed Jun. 8, 2012 for U.S. Appl. No. 12/835,704, filed on Jul. 13, 2010.
Avila a., et al., "Switching in Coplanar Amorphous Hydrogenated Silicon Devices," Solid-State Electronics, 2000, vol. 14 (1), pp. 17-27.
Cagli C., et al., "Evidence for Threshold Switching in the Set Process of Nio-based Rram and Physical Modeling for Set, Reset, Retention and Disturb Prediction", 2008 IEEE International Electron Devices Meeting (IEDM), Dec. 15-17, 2008, pp. 1-4, San Francisco, CA, USA.
Chang P.H., at al., "Aluminum Spiking at Contact Windows in Al/Ti--W/Si," Applied Physics Letters, 1988, vol. 52 (4), pp. 272-274.
Chen Y., et al., "Nanoscale Molecular-switch Crossbar Circuits," Nanotechnology, 2003, vol. 14, pp. 462-468.
Chinese Office Action (English Translation) for Chinese Application No. 201180050941.0 dated Apr. 3, 2015, 8 pages.
Chinese Office Action (English Translation) for Chinese Application No. 201280027066.9 dated Nov. 23, 2015, 5 pages.
Chinese Office Action (English Translation) for Chinese Application No. 201110195933.7 dated Jul. 31, 2014, 4 pages.
Chinese Office Action (English Translation) for Chinese Application No. 201110195933.7 dated May 18, 2015, 4 pages.
Chinese Office Action (English Translation) for Chinese Application No. 201180050941.0 dated Dec. 9, 2015, 5 pages.
Chinese Office Action (with English Translation) for Chinese Application No. 201280027066.9 mailed on Jul. 4, 2016, 5 pages.
Chinese Office Action (with English Translation) for Chinese Application No. 201290000773.4 dated Jun. 9, 2014, 3 pages.
Chinese Seach Report (English Translation) for Chinese Application No. 201180050941.0 dated Mar. 25, 2015, 1 page.
Chinese Search Report (English Translation) for Chinese Application No. 201280027066.9 dated Nov. 13, 2015, 2 pages.
Choi J.W., "Bistable [2]Rotaxane Based Molecular Electronics: Fundamentals and Applications", Dissertation, Chapter 3, California Institute of Technology, Pasadena, 2007, pp. 79-120. Retrieved from the Internet.
Chou S.Y., et al., "Imprint Lithography With 25-Nanometer Resolution," Science, 1996, vol. 272, pp. 85-87.
Collier C.P., et al., "Electronically Configurable Molecular-based Logic Gates ," Science, 1999, vol. 285 (5426), pp. 391-395.
Corrected Notice of Allowability dated Nov. 20, 2014 for U.S. Appl. No. 13/594,665, 5 pages.
Corrected Notice of Allowability dated Jun. 15, 2016 for U.S. Appl. No. 13/952,467, 10 pages.
Corrected Notice of Allowability mailed Oct. 1, 2013 for U.S. Appl. No. 13/733,828, filed d Jan. 3, 2013.
Corrected Notice of Allowance mailed Jan. 11, 2013 for U.S. Appl. No. 12/861,666 dated Aug. 23, 2010.
Dehon A., "Array-Based Architecture for FET-Based, Nanoscale Electronics," IEEE Transactions on Nanotechnology, 2003, vol. 2 (1), pp. 23-32.
Del Alamo J., et al., "Operating limits of Al-alloyed High-low Junction for BSF Solar Cells," Solid-State Electronics, 1981, vol. 24, pp. 415-420.
Den Boer W., "Threshold Switching in Hydrogenated Amorphous Silicon," Applied Physics Letters, 1982, vol. 40, pp. 312-813.
Dey S.K., "Electrothermal Model of Switching in Amorphous Silicon Films," Journal of Vacuum Science & Technology, 1980, vol. 17 (1), pp. 445-448.
Dong Y., et al., "Si/a-Si Core/Shell Nanowires as Nonvolatile Crossbar Switches," Nano Letters, 2008, vol. 8 (2), pp. 386-391.
European Search Report for Application No. EP09819890.6 mailed on Mar. 27, 2012.
European Search Report for Application No. EP11005207.3 mailed on Oct. 12, 2011.
European Search Report for Application No. EP14000949, mailed on Jun. 4, 2014, 7 pages.
European Search Report for European Application No. EP11005649 mailed Oct. 15, 2014, 2 pages.
Ex parte Quayle Action mailed May 8, 2012 for U.S. Appl. No. 12/826,653, filed Jun. 29, 2010.
Final Office Action dated Jun. 29, 2016 for U.S. Appl. No. 14/692,677, 21 pages.
Final Office Action for U.S. Appl. No. 14/612,025 dated Jun. 14, 2016, 7 pages.
Final Office Action mailed Feb. 1, 2016 for U.S. Appl. No. 14/573,817.
Final Office Action mailed May 20, 2016 for U.S. Appl. No. 14/253,796.
Final Office Action mailed Aug. 13, 2014 for U.S. Appl. No. 13/525,096, filed Jun. 15, 2012.
Gangopadhyay S., et al., "Memory Switching in Sputtered Hydrogenated Amorphous Silicon (a-Si:H)," Japanese Journal of Applied Physics, 1985, vol. 24 (10), pp. 1363-1364.
Goronkin H, et al., High-Performance Emerging Solid-State Memory Technologies, MRS Bulletin, Nov. 2004, pp. 805-813. Retrieved from the Internet.
Hiajto J., et al., "Amorphous & Microcrystalline Semiconductor Devices: Materials and Device Physics", Artech House Publishers, Mar. 1, 2004, vol. 2, pp. 640-700.

(56) References Cited

OTHER PUBLICATIONS

Hajto J., et al., "Analogue Memory and Ballistic Electron Effects in Metal-amorphous Silicon Structures," Philosophical Magazine, 1991, vol. 63 (1), pp. 349-369.
Hajto J., et al., "Electronic Switching in Amorphous-Semiconductor Thin Films", Chapter 14, 1992, pp. 640-701.
Hajto J., et al., "The Programmability of Amorphous Silicon Analogue Memory Elements," Materials Research Society Symposium Proceedings, 1990, vol. 192, pp. 405-410.
Holmes A.J., et al., "Design of Analogue Synapse Circuits using Non-Volatile a-Si:H Memory Devices", Proceedings of IEEE International Symposium on Circuits and System, 1994, pp. 351-354, vol. 6.
Hu J., et al., "AC Characteristics of Cr/p.sup.+a-Si:H/V Analog Switching Devices," IEEE Transactions on Electron Devices, 2000, vol. 47 (9), pp. 1751-1757.
Hu X.Y., et al., "Write Amplification Analysis in Flash-based Solid State Drives", SYSTOR'09; 20090504-20090406, May 4, 2009, pp. 1-9.
Hudgens S., et al., "Overview of Phase-Change Chalcogenide Nonvolatile Memory Technology", MRS Bulletin, Nov. 2004, pp. 829-832. Retrieved from the Internet.
International Search Report and Written Opinion for Application No. PCT/US2011/040362, mailed on Jan. 19, 2012, 7 pages.
International Search Report and Written Opinion for Application No. PCT/US2011/046035, mailed on Mar. 27, 2012, 6 pages.
International Search Report and Written Opinion for Application No. PCT/US2012/040232, mailed on Feb. 26, 2013, 7 pages.
International Search Report and Written Opinion for Application No. PCT/US2012/040242, mailed on Jan. 31, 2013, 9 pages.
Japanese Office Action mailed on Aug. 9, 2016 for Japanese Application No. 2014-513700, 8 pages (including translation).
Chinese Office Action mailed on Sep. 1, 2016 for Chinese Application No. 201380027469.8, 8 pages (including translation).
Office Action dated Aug. 12, 2016 for U.S. Appl. No. 14/667,346, 27 pages.
Office Action dated Aug. 12, 2016 for U.S. Appl. No. 14/613,301, 43 pages.
Office Action dated Aug. 23, 2016 for U.S. Appl. No. 14/613,585, 9 pages.
Notice of Allowance dated Sep. 14, 2016 for U.S. Appl. No. 14/588,202, 119 pages.
Notice of Allowance dated Oct. 5, 2016 for U.S. Appl. No. 14/887,050, 113 pages.
Notice of Allowance dated Oct. 7, 2016 for U.S. Appl. No. 14/213,953, 43 pages.
Office Action for U.S. Appl. No. 14/597,151 dated Oct. 20, 2016, 52 pages.
Notice of Allowance for U.S. Appl. No. 14/509,967 dated Oct. 24, 2016, 42 pages.
Notice of Allowance for U.S. Appl. No. 14/611,022 dated Oct. 26, 2016, 41 pages.
Notice of Allowance for U.S. Appl. No. 13/952,467 dated Sep. 28, 2016, 128 pages.
Notice of Allowance for U.S. Appl. No. 15/046,172 dated Oct. 4, 2016, 116 pages.
Notice of Allowance for U.S. Appl. No. 14/612,025 dated Oct. 19, 2016, 108 pages.
Office Action for U.S Appl. No. 14/588,136 dated Nov. 2, 2016, 132 pages.

\* cited by examiner

| | | READ | | PAGE ERASE | | PROGRAM | |
|---|---|---|---|---|---|---|---|
| | | PRECHARGE | SENSE | PRECHARGE | EXECUTE | PRECHARGE | EXECUTE |
| | $SL_1\ V_{BIAS}$ | $V_{dd}$ | $V_{dd}$ | 4v | 4v | 4v | 4v |
| | $SL_1$ | 0.5v | 0.5v | 0v | 0v | 3v | 3v |
| | $SL_0$ | 0.5v | 0v | 0v | 3v | 3v | 0v |
| $BLOCK_1$ | $BL_5$ | 0v | 0v | 0v | 0v | 0v | 0v |
| | $BL_4$ | 0v | 0v | 0v | 0v | 0v | 0v |
| | $BL_3$ | 0v | 0v | 0v | 0v | 0v | 0v |
| | $BL_2$ | 0.5v | 4v | 0v | 0v | 3v | 3v |
| | $BL_1$ | 0.5v | 0.5v | 0v | 0v | 1.5v | 1.5v |
| | $BL_0$ | 0.5v | 0.5v | 0v | 0v | 1.5v | 1.5v |
| | $SEL_1$ | 0v | 0v | 0v | 0v | 0v | 0v |
| | $SEL_0$ | $V_{dd}$ | $V_{dd}$ | $V_{dd}$ | $V_{dd}$ | 4v | 4v |
| $BLOCK_0$ | $BL_5$ | 0v | 0v | 0v | 0v | 0v | 0v |
| | $BL_4$ | 0v | 0v | 0v | 0v | 0v | 0v |
| | $BL_3$ | 0v | 0v | 0v | 0v | 0v | 0v |
| | $BL_2$ | 0.5v | 4v | 0v | 0v | 3v | 3v |
| | $BL_1$ | 0.5v | 0.5v | 0v | 0v | 1.5v | 1.5v |
| | $BL_0$ | 0.5v | 0.5v | 0v | 0v | 1.5v | 1.5v |
| | $WL_1$ | $V_{dd}$ | 0v | 0v | 0v | $V_{dd}$ | 0v |
| | $WL_0$ | $V_{dd}$ | $V_{dd}$ | $V_{dd}$ | $V_{dd}$ | $V_{dd}$ | $V_{dd}$ |

HIGH OPERATING SPEED RESISTIVE RANDOM ACCESS MEMORY

CLAIM OF PRIORITY AND CROSS-REFERENCE TO RELATED APPLICATIONS

The subject application for patent claims priority to and is a 35 USC §371 national stage of application of International Application No. PCT/US2013/042746filed May 24, 2013, which is a continuation of U.S. Non-provisional patent application Ser. No. 13/481,696, filed on May 25, 2012, now U.S. Pat. No. 8,619,459, patented on Dec. 31, 2013, which claims priority to U.S. Provisional Patent Application Ser. No. 61/500,547 filed Jun. 23, 2011, and incorporates by reference in their respective entireties and for all purposes the following: U.S. patent application Ser. No. 11/875,541, entitled NON-VOLATILE SOLID STATE RESISTIVE SWITCHING DEVICES and filed Oct. 19, 2007, and U.S. patent application Ser. No. 12/575,921 entitled SILICON-BASED NANOSCALE RESISTIVE DEVICE WITH ADJUSTABLE RESISTANCE and filed Oct. 8, 2009.

TECHNICAL FIELD

The present application for patent relates generally to resistive random access memory technology, and more particularly to providing a resistive random access memory having a high speed for one or more memory operations.

BACKGROUND

A recent innovation within the field of integrated circuit technology is the resistive random access memory (RRAM). Much of RRAM technology is still in the theoretical stage; various electric concepts for RRAM technology exist but the concepts are in one or more stages of verification to prove or disprove the theory. Even so, RRAM technology promises to hold substantial advantages for future growth in the semiconductor electronics industry.

According to various theoretical models, the RRAM can be configured to have multiple resistive states; for instance, the RRAM can be configured to have a relatively low resistance or a relatively high resistance. Moreover, the RRAM can generally be configured to enter one or another resistive state in response to an external condition imposed upon the RRAM. Thus, in transistor parlance, applying or removing the external condition can serve to program or de-program the RRAM. Moreover, depending on physical makeup and electrical arrangement, an RRAM can generally maintain a programmed or de-programmed state. Maintaining a state might require other conditions be met (e.g., existence of a minimum operating voltage, existence of a minimum operating temperature, . . . ), or no conditions be met, depending on a makeup of the RRAM. Generally speaking, the capacity to be in one of two states and maintain one or another of the states can serve to represent one binary bit of information. Thus, RRAM is theoretically usable as electronic memory in suitably arranged electronic circuits.

Different types of RRAM structure and physiology have been suggested, with various predicted results and operating characteristics. For example, some proposed RRAM are non-volatile memory within which a conductive filament (or many filaments) can be induced within an otherwise dielectric material. In a normal state, the dielectric has high resistance, and is non-conductive. However, application of a suitable voltage across the dielectric for example, can induce a conduction path therein. Various physical mechanisms enable generation of a conduction path in a dielectric, including defects in the material (whether natural or induced via doping), metal migration, and so on. Once the filament is formed within the dielectric, the RRAM is activated—resulting in a low resistance conduction path through the dielectric. Activation of the RRAM is established by applying a program voltage across the RRAM terminals. The RRAM cell is deactivated when the filament is retracted away from at least one of the RRAM terminals or forms a discontinuous gap within the filament. The Deactivated RRAM exhibits high resistance characteristics. RRAM deactivation is established by applying an erase voltage across the RRAM terminals. Thus, the formation and retraction of a conduction path can be referred to as a programmable conduction path, yielding similar electric characteristics as a conventional three-terminal transistor. In practice, however, the inventors of the present invention believe that the RRAM has not been commercially successful for reasons including incompatibility of RRAM fabrication materials with traditional CMOS processes, the incompatibility of RRAM processes as part of back end CMOS fabrication, and the like.

Additionally, some theoretical proposals for RRAM are expected to suffer from known drawbacks of conventional memory, such as metal oxide semiconductor (MOS) transistors, and the like. For instance, conventional NAND MOS transistors often exhibit relatively poor read performance compared with other transistor technologies, as well as relatively poor cell retention. Likewise, NOR MOS transistors have relatively large cell sizes, are less scalable than other technologies, and consume higher power. While it may be a panacea to suggest that all benefits of all transistor types can be incorporated into a single technology while avoiding all detriments, significant improvements are achieved at a relatively steady pace in MOS transistor technology, and RRAM may follow a similar technology curve.

SUMMARY

The following presents a simplified summary of the subject disclosure in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

One or more aspects of the subject disclosure provide for resistive random access memory (RRAM) having high operating speeds compared with other proposals for RRAM technology. An example of high operating speed can include a high read speed. In particular aspects, a RRAM memory can be powered at one terminal by a bitline, and connected at another terminal to a gate of a transistor having a low gate capacitance (relative to, e.g., a capacitance of the bitline). According to this arrangement, a signal applied at the bitline will quickly switch a state of the transistor gate, in response to the RRAM memory being in a conductive state. A sensing circuit configured to measure the transistor can therefore detect for a change in a suitable electrical characteristic of the transistor (e.g., current, voltage, . . . ) and determine a program state—or read—the RRAM memory from the measurement. Moreover, this measurement can occur very quickly relative to conventional RRAM that discharge the signal through the RRAM and the bitline, greatly improving the read speed of the RRAM.

In other aspects of the subject disclosure, a memory cell can comprise a set of RRAM connected to a gate of a read transistor, wherein the gate of the read transistor is also connected to a reference transistor. The reference transistor can be configured to apply a bias voltage to the gate of the read transistor, where the bias voltage is close to, but smaller than a threshold voltage of the read transistor. Accordingly, a small amount of charge from the RRAM can switch a biased gate of the read transistor, relative to an amount of charge to switch an unbiased transistor gate. Reducing the amount of charge can further improve read speeds for the RRAM. According to particular aspects of the subject disclosure, the reference transistor can be configured as a current source during read operations, mitigating effects of RRAM off current at the read transistor. In an alternative aspect, the reference transistor can be configured as a voltage source in conjunction with a non-linear resistance RRAM element.

According to additional aspects, disclosed is a memory architecture comprising a set of multiple RRAM operably connected to a gate of a read transistor for high read speed. One of a set of bitlines can be connected to respective RRAM, where powering one of the set of bitlines can facilitate operating upon one of the set of RRAM. Thus, programming, reading or erase individual RRAM can be accomplished by controlling voltages at respective ones of the set of bitlines. According to this architecture, a low profile, high RRAM density arrangement can be provided by connecting a plurality of RRAM to a single read transistor (thereby reducing a number of read transistors and associated circuitry). According to particular aspects, multiple sets of RRAM can be operably connected to the read transistor, where respective sets can be connected to or isolated from the read transistor by one or more select transistors. The arrangement comprising multiple sets of RRAM operably connected to the read transistor can be replicated along wordlines and bitlines of an electronic memory architecture, resulting in scalability of the high density arrangement.

The following description and the annexed drawings set forth in detail certain illustrative aspects of the disclosed subject matter. These aspects are indicative, however, of but a few of the various ways in which the principles of the innovation can be employed and the disclosed subject matter is intended to include all such aspects and their equivalents. Other advantages and novel features of the disclosed subject matter will become apparent from the following detailed description of the innovation when considered in conjunction with the drawings.

BRIEF DESCRIPTION OF THE DRAWINGS

FIG. 8 illustrates a diagram of an example operating table for programming, erasing and reading the semiconductor layout of FIG. 7.

DETAILED DESCRIPTION

Figure 1:
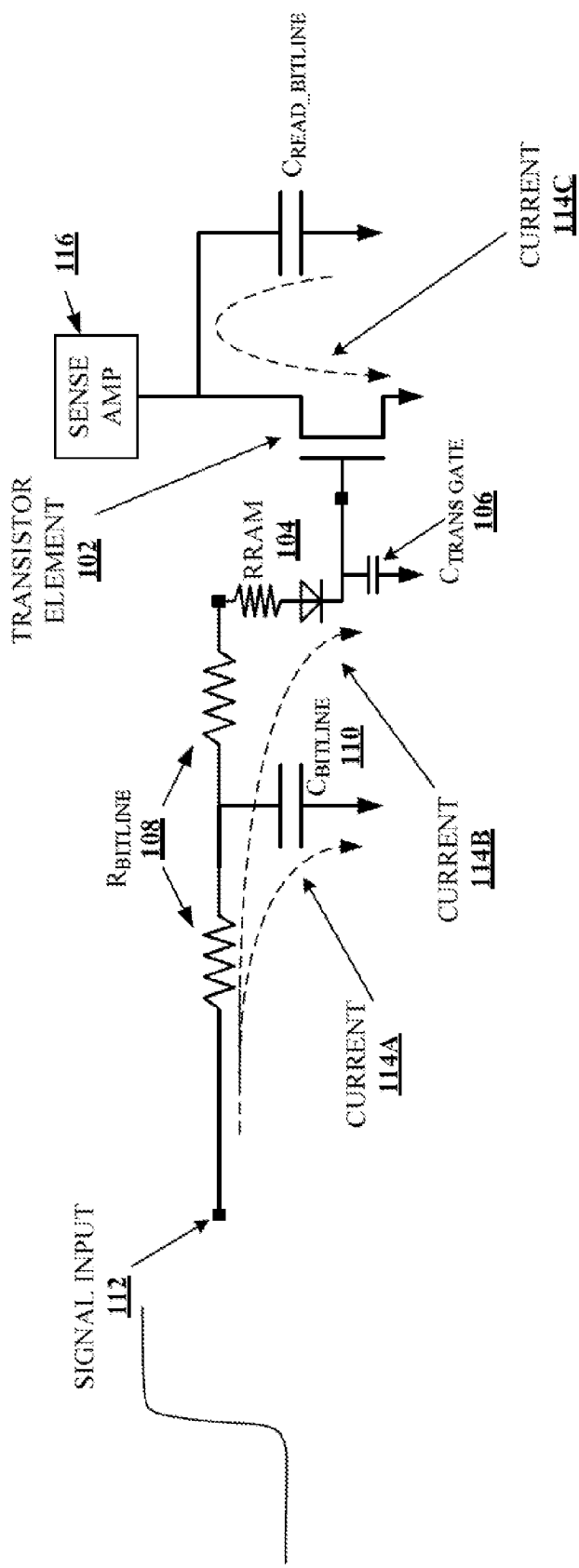
FIG. 1 illustrates a circuit diagram of an example electronic resistive random access memory (RRAM) circuit according to aspects of the subject disclosure.

The disclosed subject matter is described with reference to the drawings, wherein like reference numerals are used to refer to like elements throughout the description. In the following description, for purposes of explanation, numerous specific details are set forth in order to provide a thorough understanding of the subject innovation. It may be evident, however, that the disclosed subject matter may be practiced without these specific details, in other instances, well-known structures and devices are shown in block diagram or schematic form in order to facilitate describing the subject innovation.

Aspects of the subject disclosure provide for resistive random access memory (RRAM) having high operating speeds compared with conventional memory, and compared with existing proposals for RRAM technology. An example of an RRAM can include a filamentary-based RRAM, which in turn can include: a p-type silicon bearing layer (e.g., p-type polysilicon, p-type SiGe), an undoped amorphous silicon layer (i.e., having intrinsic characteristics), and an active metal layer for providing filament forming ions to the amorphous silicon layer (e.g., silver (Ag), gold (Au), nickel (Ni), aluminum (Al), chromium (Cr), iron (Fe), manganese (Mn), tungsten (W), vanadium (V), cobalt (Co), platinum (Pt), and palladium (Pd)). Some details pertaining to RRAM similar to the foregoing example can be found in the following University of Michigan U.S. patent applications that are licensed to the assignee of the present application for patent: application Ser. No. 11/875,541 filed Oct. 19, 2007 and application Ser. No. 12/575,921 filed Oct. 8, 2009.

It should be appreciated that a variety of RRAM technologies exist, having different physical properties. For instance, different RRAM technologies can have different discrete programmable resistances, different associated program/erase voltages, as well as other differentiating characteristics. For instance, a unipolar RRAM, once initially programmed, can be later programmed in response to a first positive voltage (e.g., three volts) and erased in response to a second positive voltage (e.g., between four and five volts). Bipolar RRAM, on the other hand, becomes programmed in response to a positive voltage and erased in response to a negative voltage. Where no specific RRAM technology or program/erase voltage is specified for the various aspects and embodiments herein, it is intended that such aspects and embodiments incorporate any suitable RRAM technology and be operated by program/erase voltages appropriate to that RRAM technology, as would be known by one of ordinary skill in the art or made known by way of the context provided herein. It should be appreciated further that where substituting a different RRAM technology would require circuit modifications that would be known to one of ordinary skill in the art, or changes operating signal levels that would be known to one of such skill, embodiments comprising the substituted RRAM technology(ies) or signal level changes are considered within the scope of the subject disclosure.

RRAM memory cells have several advantages over conventional RAM—such as static RAM or dynamic RAM—and conventional transistors, such as metal oxide semiconductor (MOS) transistors. First, RRAM technology can generally be small, consuming silicon area on the order of 4 $F^2$ per adjacent RRAM device (e.g., a memory cell comprising two RRAM devices would therefore be approximately 8 $F^2$ if constructed in adjacent silicon space). Non-adjacent RRAM devices, e.g., stacked above or below each other, can consume as little as 4 $F^2$ for a set of multiple non-adjacent devices. This leads to great semiconductor component density, and low manufacturing costs for a given number of transistors. RRAM also has fast programming speed and low programming current, and smaller cell sizes enabling greater component densities. Additionally, RRAM is non-volatile memory, having the capacity to store data without continuous application of power. In addition to the foregoing, RRAM cells can generally be built between metal interconnect layers, enabling RRAM-based devices to be usable for two-dimension as well as three-dimension semiconductor architectures.

Referring now to the drawings, FIG. 1 illustrates an example electrical circuit diagram for an RRAM circuit 100 according to aspects of the subject disclosure. RRAM circuit 100 can comprise a transistor element 102 having a gate that is connected to a terminal of an RRAM 104. Transistor element 102 will generally have a relatively fast switch time, which is a time between a gate voltage exceeding a threshold voltage of transistor element 102 and conductance of the transistor element 102. In addition, transistor element 102 can be selected to have a relatively low gate capacitance 106 (e.g., by having a small channel width or channel length), thereby reducing time for charge to flow from RRAM 104 and accumulate at the gate of transistor element 102. In various aspects of the subject disclosure, transistor element 102 can comprise a variety of suitable transistors, such as a MOS transistor, including a complementary MOS, a metal oxide semiconductor field effect transistor (MOSFET), an n-channel MOSFET or NMOS transistor, a p-channel MOSFET or PMOS transistor, or the like.

RRAM 104 is depicted as a non-linear resistance device. Particularly, RRAM 104 can be depicted schematically as a combination of a resistive component (depicted by the resistor sign) and a diode component (having an arrow pointing downward). In operation, the non-linear resistance device can have linear resistance for current flowing in a first direction (downward), and a much higher resistance for current flowing in a reverse direction (upward). Essentially this implies that RRAM 104 permits current to flow in a single direction (toward the diode arrow) when RRAM 104 is activated, and generally preventing or mitigating current flow in an opposite direction (away from the arrow). However, RRAM 104 is not limited to a non-linear resistance element, and can comprise only the resistive element without the diode element in alternative embodiments of the subject disclosure.

In addition to the foregoing, RRAM 104 has properties generally associated with RRAM devices, in that RRAM has relatively high resistance when de-activated, and relatively low resistance when activated. Thus, when measured with respect to a suitable scale of current for an activated RRAM (e.g., about a hundred nanoamps or more), RRAM 104 can be said to either permit or mitigate current flow through RRAM 104, when activated or deactivated respectively. In this manner RRAM 104 can act as a transistor, being programmed when permitting current to flow (e.g., 100 nanoamps or higher) and de-programmed or erased when resisting current flow (e.g., 1 nanoamp and lower).

A bitline is connected to an opposite terminal of RRAM 104 from the terminal connected to transistor element 102. The bitline is represented by a resistance-capacitance-resistance model, or R-C-R model, comprising bitline resistance 108 and bitline capacitance 110. Generally, bitline capacitance 110 is much larger than gate capacitance 106 of transistor element 102. When a signal input 112 (e.g., voltage signal, current signal, . . . ) is set to a suitable voltage (e.g., a read voltage, . . . ) a first current 114A will flow through the bitline and a second current 114B will flow to RRAM 104. Because gate capacitance 106 of transistor element 102 has a low capacitance value (e.g., relative to bitline capacitance 110), signal input 112 can propagate through an activated RRAM 104 to the gate of transistor element 102 very quickly, toggling transistor element 102 to an activated state and enabling a transistor current 114C to flow through a channel region of transistor element 102. Transistor current 114C can be measured by a sensing amplifier 116 as an indicator of the activation or deactivation state of RRAM 104. Specifically, a change in transistor current 114C (e.g., an increase) can indicate that RRAM 104 is in an activated state, whereas a lack of change in transistor current 114C can indicate that RRAM 104 is in a de-activated state. Determining an activation/deactivation state of RRAM 104, in the parlance of a memory transistor, indicates whether RRAM 104 carries a 0 or a 1 of binary digital information.

As depicted, the read time of RRAM 104 is proportional to a switch time of transistor 102 in response to an increase in voltage or current at signal input 112. This switch time is proportional to ($R_{RRAM\ ON} * C_{TRANS\ GATE}$ 106), where $R_{RRAM\ ON}$ is the resistance of RRAM 104 when activated, and $C_{TRANS\ GATE}$ 106 is the capacitance of the gate of transistor element 102. Because the capacitance of the gate of transistor element 102 is small, the switch time of transistor element 102 is small, resulting in a small read time for RRAM 104.

Conventional proposals of RRAM arrays require the charge on the bitline (e.g., signal input 112) to discharge to a grounded RRAM device and the current amount or voltage swing on the signal input to be sensed at signal input 112. Since the RRAM resistance multiplied by bitline capacitance is large, the conventional method of sensing will be slower than the approach disclosed above in regard to RRAM circuit 100. Thus, read times for conventional RRAM arrays can be very large compared to the read time of RRAM 104. This provides a very significant advantage for RRAM circuit 100, because read time is an important characteristic of electronic memory; the faster the read time the more versatile the device. Particularly in the case of random access memory which is often utilized for application, process or thread-level communication with high speed computer processors (e.g., operating on multiple gigahertz clock speeds), read time can be a significant limitation for conventional RRAM proposals. Accordingly, the RRAM circuit of FIG. 1, as well as other embodiments disclosed herein, provides a substantial improvement to existing technology.

Figure 2:
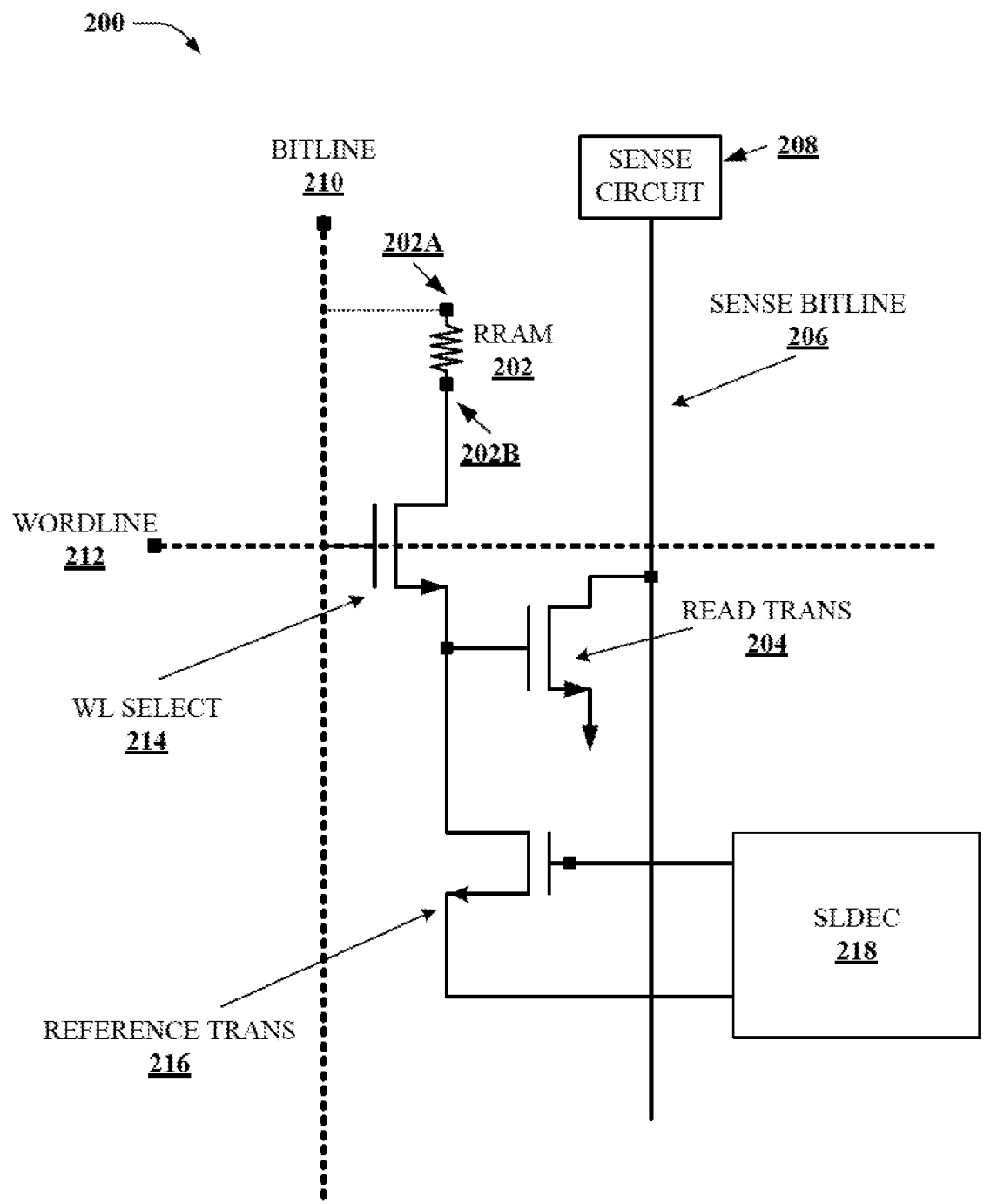
FIG. 2 depicts a diagram of a sample semiconductor layout corresponding with the circuit diagram of FIG. 1, in one or more aspects.

FIG. 2 depicts a diagram of an example layout for an electronic memory 200 according to further aspects of the subject disclosure. Electronic memory 200 can comprise a RRAM 202 connected at a first RRAM terminal 202A to a bitline 210 of electronic memory 200. Although only a single bitline 210 is depicted, it should be appreciated that electronic memory 200 can comprise many bitlines in various suitable arrangements. Additionally, respective ones of these bitlines can be connected to one or more other RRAM components, not depicted here. It should also be appreciated that, according to various other embodiments, bitline 210 and other bitlines of electronic memory 200 can be connected to multiple RRAM components. In this case, respective RRAM components can be activated or deactivated on a particular bitline by a select transistor(s), a wordline(s), or other suitable mechanism for delivering a signal to a subset of electrical components that is less than a set of such components connected to the particular bitline.

Electronic memory 200 can further comprise a read transistor 204 having a gate that can be connected or disconnected to a second RRAM terminal 202B of RRAM 202 via a wordline select transistor 214. A channel region of read transistor 204 can be connected to a sensing bitline 206. This arrangement enables a sensing circuit 208, connected to sensing bitline 206, to measure electrical characteristics of the channel region of read transistor 204. Additionally, sensing bitline 206 can be isolated from memory components (e.g., RRAM 202) of electronic memory 200, utilized for reading these memory components via one or more read transistors, but not configured to power or otherwise deliver a signal to such memory components. For instance, sensing bitline 206 can be decoupled from a stimulus source of electronic memory 200 (e.g., wherein the stimulus source is bitline 210 and a signal input applied to bitline 210). Thus, stimulus is applied at bitline 210 and sensing is applied at sensing bitline 206, in contrast for instance, to applying a stimulus and sensing on the same bitline. In at least one aspect of the subject disclosure, bitline 210 and sensing bitline 206 can have a contrary configuration, in that electronic memory 200 can power RRAM 202 and read RRAM 202 from separate bitlines dedicated at least in part to those respective functions.

In some aspects, as depicted, wordline select transistor 214 can be positioned in a path between second RRAM terminal 202B and the gate of read transistor 204. A gate of wordline select transistor 214 can be connected to a wordline 212 of electronic memory 200. This configuration enables wordline select transistor 212 to electrically connect RRAM 202 to the gate of read transistor 204 when wordline select transistor 212 is activated by a suitable signal applied at wordline 212, and enables wordline select transistor 212 to electrically isolate RRAM 202 from the gate of read transistor 204 when wordline select transistor 212 is deactivated (e.g., by lack of the suitable signal applied at wordline 212). As depicted, RRAM 202, read transistor 204, bitline 210 and wordline select transistor 214 are configured such that activation of wordline select transistor 212 can cause a signal applied to bitline 210 to propagate to the gate of read transistor 204, in the event that RRAM 202 is activated. A resulting voltage applied at the gate of read transistor 204 in response to this signal can switch read transistor 204 to a conductive state, if the voltage exceeds a threshold voltage of read transistor 204. Therefore, because toggling of read transistor 204 is dependent on the activation/deactivation state of RRAM 202, a program or erase state of RRAM 202 can be determined by sensing circuit 208 from an electrical characteristic(s) of read transistor 204 exhibited at sensing bitline 206.

According to further aspects of the subject disclosure, electronic memory 200 can comprise a reference transistor 216 connected to the gate of read transistor 204. Reference transistor 216 can be configured to apply a bias voltage to the gate of read transistor 204. This bias voltage can be set to a level that is close to, but less than, the threshold voltage of read transistor 204. As an example, if the threshold voltage of read transistor 204 is 0.6 volts, the bias voltage can be pre-charged to 0.5 volts, or a similar voltage level. Thus, the bias voltage brings the gate of read transistor 204 close to the threshold voltage, so that a small amount of charge propagating from RRAM 202 (e.g., causing about a hundred millivolt increase to the gate voltage in the example above) can switch or activate read transistor 204. By reducing an amount of charge required to be delivered to the gate of read transistor 204 by RRAM 202, a response time of read transistor 204 can be further reduced. Operation of reference transistor 216, which acts as a current source path during a read operation, can be controlled by source line decoder (SLDEC) 218. As one example, SLDEC 218 can set a current value of reference transistor 216 acting as a current source, large enough to obviate any off current that might flow through RRAM 202 when RRAM 202 is deactivated. SLDEC 218 can activate or deactivate reference transistor 216 by controlling a gate voltage of reference transistor 216, and can set the bias voltage by applying a voltage level to a channel region of reference transistor 216.

Figure 3:
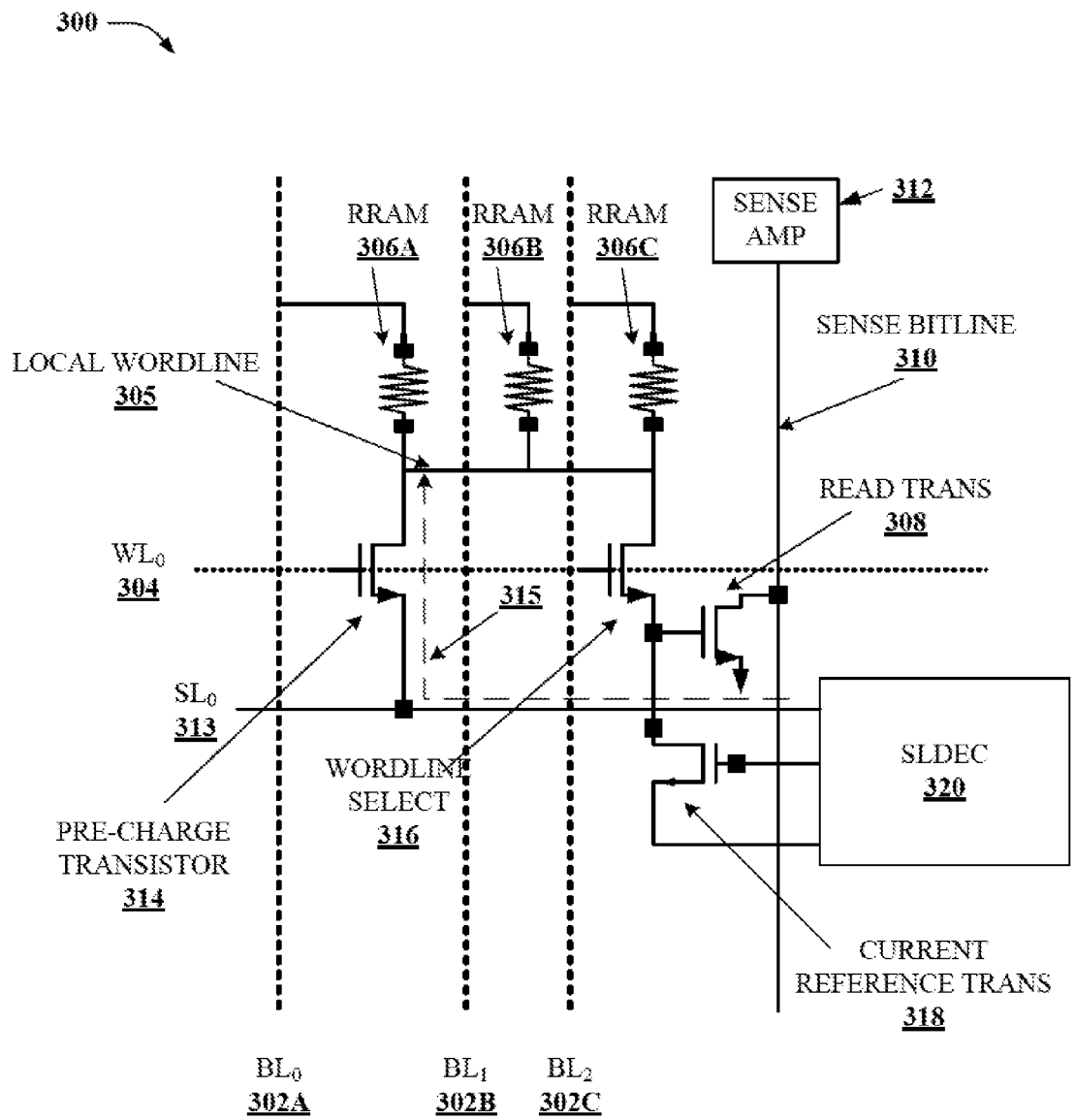
FIG. 3 illustrates a block diagram of an example semiconductor layout having a plurality of RRAM operably connected to a read transistor in particular aspects.

FIG. 3 illustrates a diagram of an example electronic memory 300 connecting a plurality of RRAM devices to a read transistor, according to further aspects of the subject disclosure. Electronic memory 300 can comprise a set of bitlines, including bitline$_0$ (BL$_0$) 302A, bitline$_1$ (BL$_1$) 302B and bitline$_2$ (BL$_2$) 302C (referred to collectively as bitlines 302A-302C), and a wordline(s) 304 generally transverse to bitlines 302A-302C. In addition, electronic memory 300 can comprise a set of RRAM including RRAM 306A, RRAM 306B and RRAM 306C (referred to collectively as RRAM 306A-306C). Each of RRAM 306A-306C are connected at respective first terminals to a respective one of bitlines 302A-302C, as depicted. RRAM 306A-306C can be programmed, erased or read by a suitable program, erase or read voltage applied at one of respective bitlines 302A-302C that propagates to the respective first terminals of RRAM 302A-302C.

A second terminal of respective RRAM 306A-306C are connected at a local wordline 305. Local wordline 305 in turn can be connected to a wordline select transistor 316, and a pre-charge transistor 314, each of which can be activated by wordline 304. When activated, wordline select transistor 316 electrically connects local wordline 305 and therefore the second terminals of RRAM 306A-306C to a gate of a read transistor 308. Likewise, when deactivated, read select transistor 316 electrically isolates the second terminals of RRAM 306A-306C to the gate of read transistor 308. As discussed in more detail below, wordline 305 activates and deactivates pre-charge transistor 314 as well, facilitating applying a pre-charge current at local wordline 305 according to some aspects of the subject disclosure. In other aspects, pre-charging can be facilitated through current reference transistor 318 and wordline select transistor 316 (e.g., see FIG. 4, infra).

Upon activation of wordline select transistor 314 by wordline 304, a selected RRAM 306A-306C can be operated by applying a suitable operation voltage (e.g., read voltage, program voltage, erase voltage, . . . ) to a corresponding one of bitlines 302A-302C. Operation of non-selected RRAM 306A-306C can be prohibited by not applying the operation voltage to the corresponding bitlines 302A-302C connected to the non-selected RRAM 306A-306C. Alternatively, non-selected RRAM 306A-306C can be prohibited from operation by applying a prohibition voltage to associated bitlines 302A-302C, allowing the associated bitlines 302A-302C to float (no applied voltage), or the like, or a suitable combination thereof. Thus, to read RRAM 306B and prohibit reading of RRAM 306A and RRAM 306C, a suitable activation signal can be applied at wordline 304 to activate wordline select transistor 316, and a suitable read voltage can be applied to bitline 302B. In addition, a prohibit voltage (e.g., a low voltage, an opposite polarity voltage from the read voltage, . . . ) can be applied to bitlines 302A and 302C. If active, current can flow through RRAM 306B to a gate of read transistor 308, which in turn can change an electrical characteristic (e.g., current, voltage, . . . ) at a sensing bitline 310, which can be detected by a sensing amplifier 312.

Additionally, a reference transistor 318 can pre-charge the gate of read transistor 308 with a bias voltage, as described at FIG. 2, supra, improving response times of read transistor 308. Further, reference transistor 318 can be operated as a current source by an SLDEC 320 for read operations. A current value of the current source can be selected by SLDEC 320 based on the RRAM 306A-306C and signal input applied at bitlines 302A-302C. More particularly, the current value of the current source can be selected to obviate an off current anticipated for deprogrammed or deactivated RRAM 306A-306C (e.g., where an off current is about 1 nanoamp, the current source can be operated at about 10 nanoamps, or another suitable level for obviating off current effects of RRAM 306A-306C on the gate of read transistor 308).

By aggregating multiple RRAM 306A-306C with a single read transistor 308, electronic memory 300 can achieve a higher component density. For instance, electronic memory 200 of FIG. 2 comprises a single RRAM connected to a single read transistor. In this arrangement, a read transistor could be used for each RRAM. By connecting multiple RRAM to a single read transistor, however, electronic memory 300 can have the improved component density relative to electronic memory 200.

According to a particular aspect of the subject disclosure, a pre-charge path 315 can facilitate application of a pre-charge signal to local wordline 305. The pre-charge signal can enable, for instance, mitigation of leakage current among the RRAM 306A-306C or among the bitlines 302A-302C. Because each of the RRAM 306A-306C have their second terminals connected at local wordline 305, a voltage difference at respective RRAM 306A-306C can result in a leakage current from one bitline to another, resulting in cross-talk or potential errors. SLDEC 320 can be configured to pre-charge local wordline 305 through a source line 313 and pre-charge transistor 314, to apply a pre-charge voltage configured to counter-balance the leakage current. For instance, a pre-charge voltage might be equal in magnitude to a voltage difference between one or more RRAM 306A-306C, to mitigate a voltage drop across one or more of RRAM 306A-306C prior to or concurrent with a related operation pertaining to one or more of RRAM 306A-306C (e.g., read operation, program operation, erase operation, . . . ). As an example of suitable voltages for pre-charging, see FIGS. 7 and 8, infra.

Figure 4:
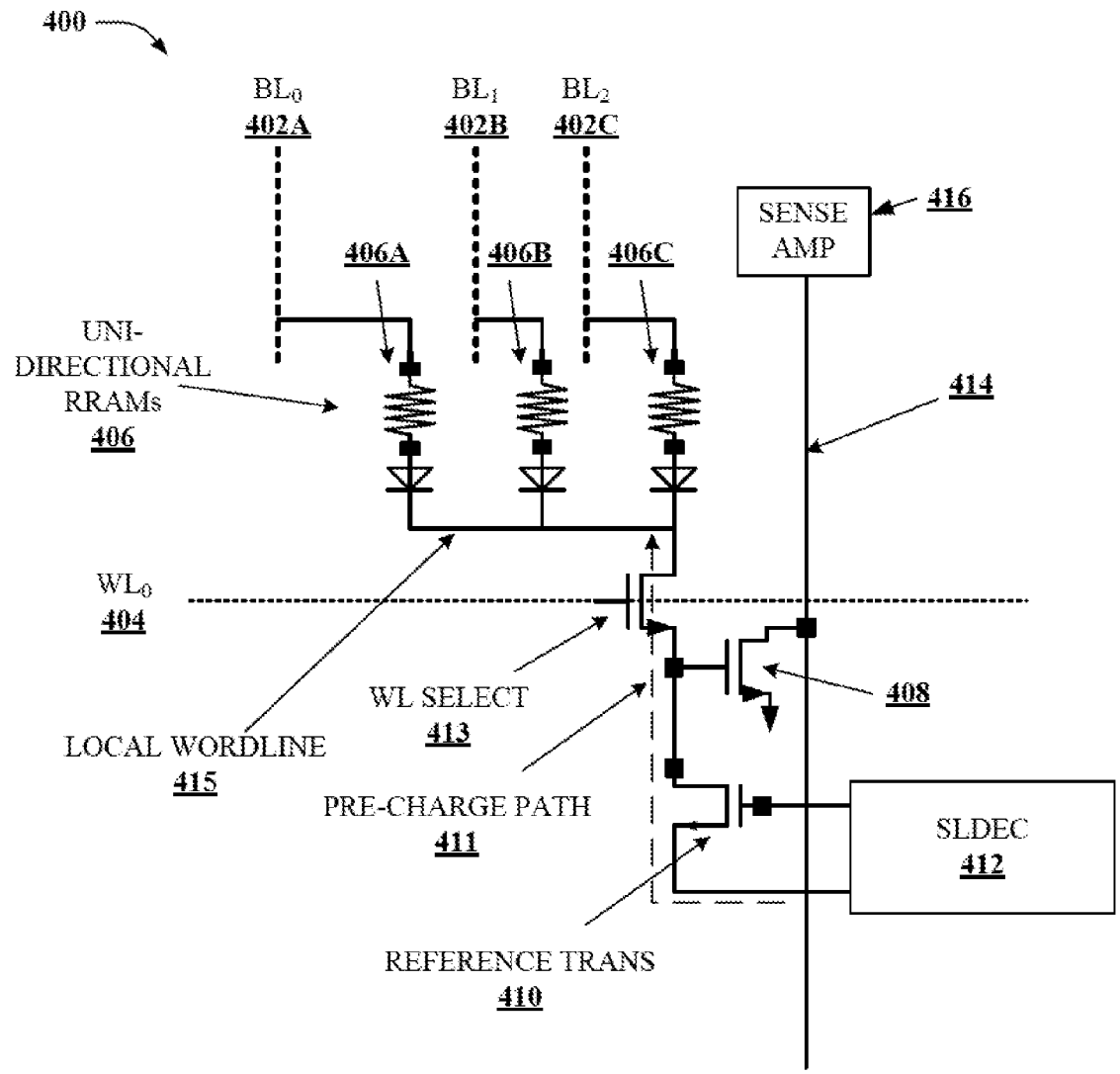
FIG. 4 depicts a block diagram of a sample semiconductor layout having a plurality of non-linear resistance RRAM coupled to the read transistor of FIG. 3.

FIG. 4 illustrates a diagram of an example electronic memory 400 according to alternative or additional aspects of the subject disclosure. Electronic memory 400 can comprise a set of bitlines, including $BL_0$ 402A, $BL_1$ 402B and $BL_2$ 402C (referred to collectively as bitlines 402A-402C), and one or more wordlines 404. A first terminal of a set of RRAM can be connected to respective ones of bitlines 402A-402C, including RRAM 406A, RRAM 406B and RRAM 406C (referred to collectively as RRAM 406A-406C). Note that RRAM 406A-406C can be non-linear resistance RRAM, permitting current flow under normal operating conditions (e.g., a typical read voltage) in a single direction. The non-linear resistance RRAM are depicted in FIG. 4 by the combination of a resistive component and a diode component, in which the diode component allows current to flow downward, toward a gate of a read transistor 408. In other words, non-linear resistance as referred to herein, indicates that the RRAM will permit current to flow in a single direction during a read operation, and will not permit current to flow or resist current flow in an opposite direction during the read operation.

In addition to the foregoing, electronic memory 400 can comprise a reference transistor 410 and a SLDEC 412. Reference transistor 410 and SLDEC 412 can operate as a current source in at least one disclosed aspect. In this arrangement, reference transistor 410 and SLDEC 412 can apply a bias voltage to the gate of reference transistor 408 without driving the gate voltage of reference transistor 408 to a particular value. By choosing the bias voltage properly, reference transistor 410 and SLDEC 412 can improve switching times of read transistor 408, as described herein.

In addition, SLDEC 412, reference transistor 410 and a wordline select transistor 413 can provide a pre-charge path 411 for a local wordline 415 connected to RRAM 406A-406C. As described herein, the pre-charge path can be utilized to apply a suitable pre-charge signal to local wordline 415. This pre-charge signal can be utilized to further mitigate or avoid current leakage between bitlines 402A-402C. Note that pre-charge path 411 can be employed with linear resistance RRAM as well (e.g., RRAM 306A-306C of FIG. 3, supra). Thus, non-linear resistance RRAM and pre-charge path 411 can be implemented separately, or in conjunction, or not at all (per FIG. 3, as one example).

Respective RRAM 406A-406C can be operated by applying a suitable activation voltage at wordline 404, and by applying a suitable operation voltage (e.g., read voltage, program voltage, erase voltage, . . . ) at one of bitlines 402A-402C. Non-selected RRAM 406A-406C can be prohibited from operating by application of a prohibition voltage, zero volts, no voltage source (e.g., floating), or the like. For a read operation, as an example, a read voltage applied at one of bitlines 402A-402C can cause a current to flow through a corresponding one of RRAM 406A-406C, if the corresponding RRAM is activated. This current can switch a state of read transistor 408, enabling a current to flow from a sense amplifier 416 through a sensing bitline 414. Current flowing through sensing bitline 414 can be indicative of the activated state of the corresponding RRAM, whereas lack of current flowing through sensing bitline 414 can be indicative of a deactivated data of corresponding RRAM, facilitating reading the state of the corresponding RRAM.

Figure 5:
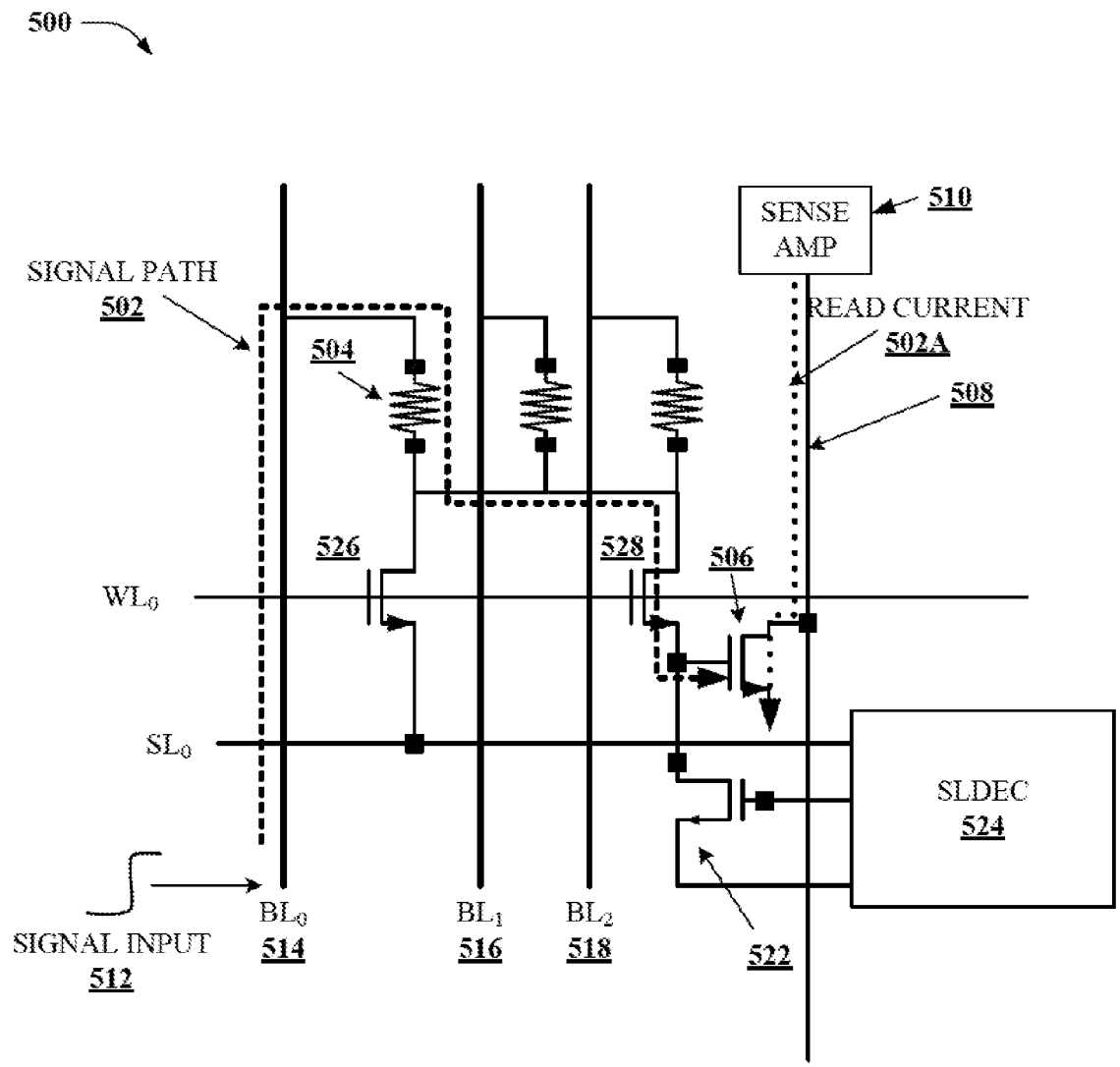
FIG. 5 illustrates a block diagram of an example current path for a semiconductor layout according to various aspects of the subject disclosure.

FIG. 5 illustrates a diagram of an example electronic memory 500 including a signal path 502 for a read operation of high speed RRAM, according to aspects of the subject disclosure. Signal path 502 is depicted as a dashed line originating from a signal input 512 applied at a first bitline $BL_0$ 514 of a set of bitlines, which includes $BL_0$ 514, $BL_1$ 516 and $BL_2$ 518 (referred to collectively as bitlines 514-518). Current flowing along signal path 502 encounters an RRAM 504 connected to $BL_0$ 514. If RRAM 504 is activated, current flows through RRAM 504 to a gate of a read transistor 506, toggling read transistor 506 and resulting in a read current 502A at a sensing bitline 508 of electronic memory 500, which can be detected by a sensing amplifier 510. Read current 502A is indicated by a dotted line traveling from sensing amplifier 510 through read transistor 506 to ground.

In the event that RRAM 504 is deactivated, current is resisted along signal path 502 at RRAM 504. Additionally, reference transistor 522 is operated as a current source, sinking a current at the gate of read transistor 506 to a value that exceeds an off current that manages to flow at RRAM 504. Accordingly, read transistor 506 does not switch state and read current 502A does not flow through sensing bitline 508. Lack of the read current 502A is indicative of RRAM 504 being in a deactivated state.

Electronic memory 500 can be substantially similar to other electronic memory disclosed herein. For instance, in one aspect, RRAM 504 can be a linear resistance device similar to RRAM 306A-306C, and a reference transistor 522 and SLDEC can pre-charge a common wordline connected to respective terminals of multiple RRAM 306A-306C, mitigating cross-bitline current leakage at the common wordline. In another aspect, RRAM 504 can comprise a non-linear resistance device similar to RRAM 406A-406C of FIG. 4, supra. In such case, non-selected RRAM 406A-406C can be prohibited from operating by application of a prohibition voltage, or zero volts, or by floating bitlines of non-selected RRAM 406A-406C, due to the anti-current leakage properties of the non-linear resistance RRAM 406A-406C. Combinations of the foregoing or similar aspects of the subject disclosure can also be implemented.

Although not depicted, electronic memory 500 can have one of multiple pre-charge paths for pre-charging RRAM 504 in conjunction with (e.g., prior to) applying signal input 512. A suitable pre-charge path can be facilitated by a source line, $SL_0$ connected to SLDEC 524, and a pre-charge transistor 526 activated by $WL_0$ and connected to RRAM 504. Alternatively, the pre-charge path can be facilitated by reference transistor 522 in conjunction with a wordline select transistor 528 connected to RRAM 504. In the first case, a pre-charge path provides current flow from SLDEC 524 through $SL_0$ and pre-charge transistor 526. In the latter case, the pre-charge path provides current flow from SLDEC 524, through reference transistor 522 and wordline select transistor 528 (e.g., see FIGS. 3 and 4, respectively).

Figure 6:
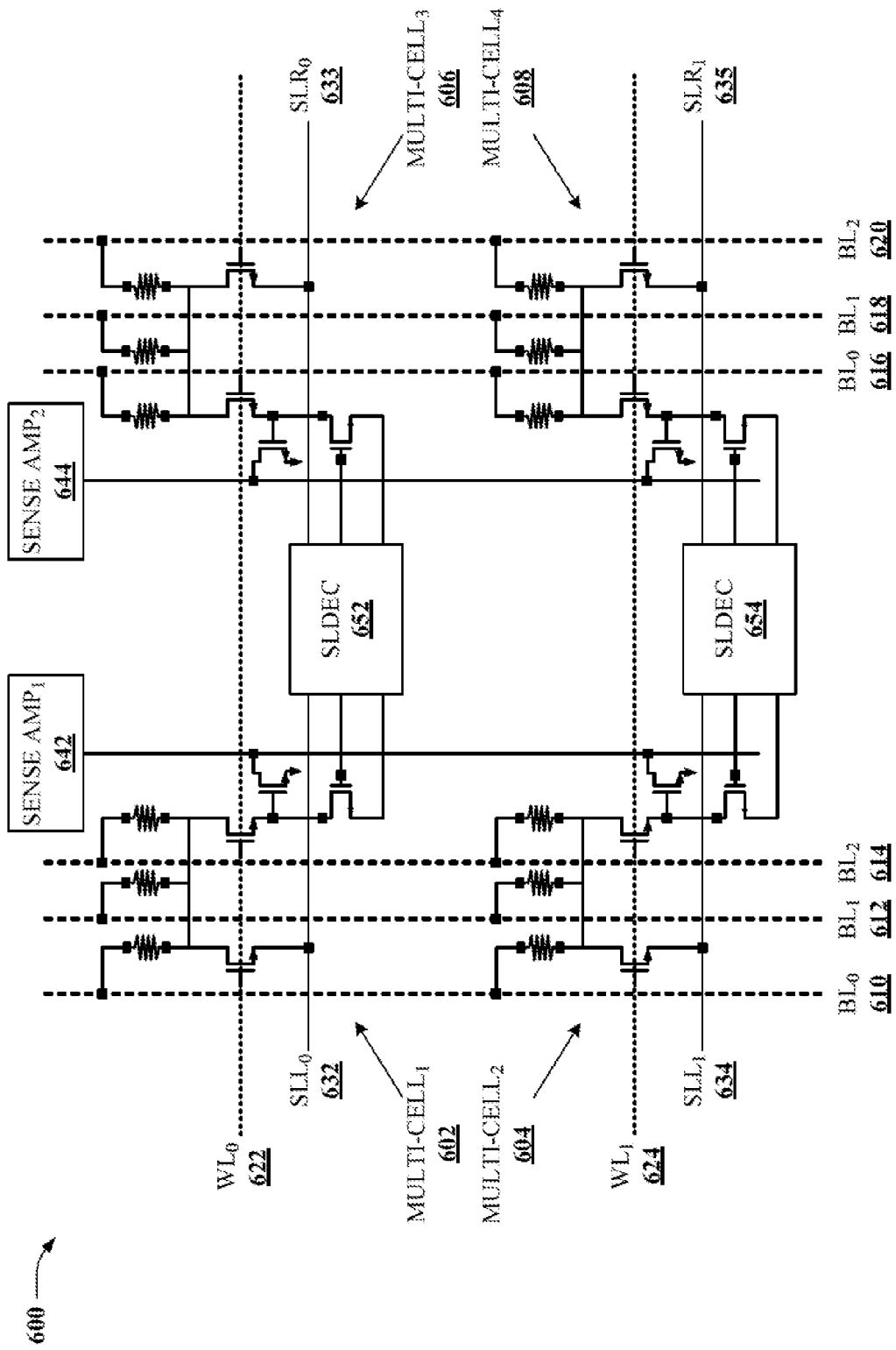
FIG. 6 illustrates a diagram of an example semiconductor layout for a four by four block of RRAM according to further aspects of the subject disclosure.

FIG. 6 depicts a diagram of an example electronic memory 600 according to still other aspects of the subject disclosure. Electronic memory 600 comprises four multi-cell memory sectors organized in respective quadrants of electronic memory 600. Particularly, the multi-cell memory sectors include multi-cell$_1$ 602 at an upper right quadrant of electronic memory 600, multi-cell$_2$ 604 at a lower left quadrant of electronic memory 600, multi-cell$_3$ 606 at an upper right quadrant of electronic memory 600, and multi-cell$_4$ 608 at a lower right quadrant of electronic memory 600, referred to collectively as multi-cells 602-608. A set of bitlines are depicted, including a first subset of bitlines $BL_0$ 610, $BL_1$ 612 and $BL_2$ 614 traversing the upper left and lower left quadrants, and a second subset of bitlines $Bl_0$ 616, $BL_1$ 618, and $BL_2$ 620 traversing the upper right and lower right quadrants, respectively. The first subset of bitlines are referred to collectively as first subset of bitlines 610-614, whereas the second subset of bitlines are referred to collectively as second subset of bitlines 616-620. Furthermore, electronic memory 600 comprises a wordline $WL_0$ 622 traversing the upper left and upper right quadrants, and a wordline $WL_1$ 624 traversing the lower left and lower right quadrants of electronic memory 600.

Respective multi-cells 602-608 comprise a set of RRAM devices connected respectively to one of the set of bitlines. RRAM devices of a particular one of multi-cells 602-608 can be operated by activating one of wordlines $WL_0$ 622 or $WL_1$ 624 and applying an operating signal to a bitline of either the first subset of bitlines 610-614 or the second set of bitlines 616-620. Thus, for instance, to read the middle RRAM of multi-cell$_4$ 608, $WL_1$ 624 can be activated in conjunction with applying a read voltage to $BL_1$ 618. It should be appreciated that RRAM devices of electronic memory 600 can comprise linear resistance devices, non-linear resistance devices, uni-polar devices or bipolar devices, in various alternative or additional embodiments. Suitable changes in read, write or program operations can be implemented for respective types of RRAM devices as well, without departing from the scope of the subject disclosure.

Pre-charging can be accomplished utilizing a pre-charge path comprising a left-side source line, $SLL_0$ 632 or $SLL_1$ 634, and associated pre-charge transistor (e.g., see pre-charge transistor 314 of FIG. 3, supra) for multi-cells 602 and 604. Likewise, for multi-cells 606 and 608, a right-side source line, $SLR_0$ 633 or $SLR_1$ 635 can be activated along with a pre-charge transistor associated with these cells. As depicted, the pre-charge transistor(s) are activated by $WL_0$ 622 or $WL_1$ 624.

Respective ones of a pair of sense amplifiers 642, 644 can be connected to multi-cells 602, 604 and multi-cells 606, 608, respectively, for determining a state of RRAM devices of the left quadrant multi-cells 602, 604 or right quadrant multi-cells 606, 608, respectively. Note that a single sensing bitline can be utilized by respective sense amplifiers 642, 644 to determine RRAM device states for a plurality of multi-cells 602-608. Particularly, sensing amplifier$_1$ 642 is connected to respective read transistors of multi-cell$_1$ 602 and multi-cell$_2$ 604 by a common sensing bitline. Likewise, sensing amplifier$_2$ 644 is connected to respective read transistors of multi-cell$_3$ 606 and multi-cell$_4$ 608 by a common sensing bitline. Also depicted are a set of SLDECs, including SLDEC 652 for controlling bias voltages at multi-cell$_1$ 602 and multi-cell$_3$ 606, and SLDEC 654 for controlling bias voltage at multi-cell$_2$ 604 and multi-cell$_4$ 608. SLDECs 652 and 654 are also configured for setting and applying pre-charge voltages for multi-cells 602-608. Particularly, SLDEC 652 can be configured to apply a pre-charge signal to multi-cell 606 along SLR 633, and to apply a pre-charge signal to multi-cell 602 via $SLL_0$ 632, and similarly SLDEC can apply the pre-charge signal to multi-cell 604 at $SLL_1$ 634 and to multi-cell 608 at $SLR_1$ 635.

Figure 7:
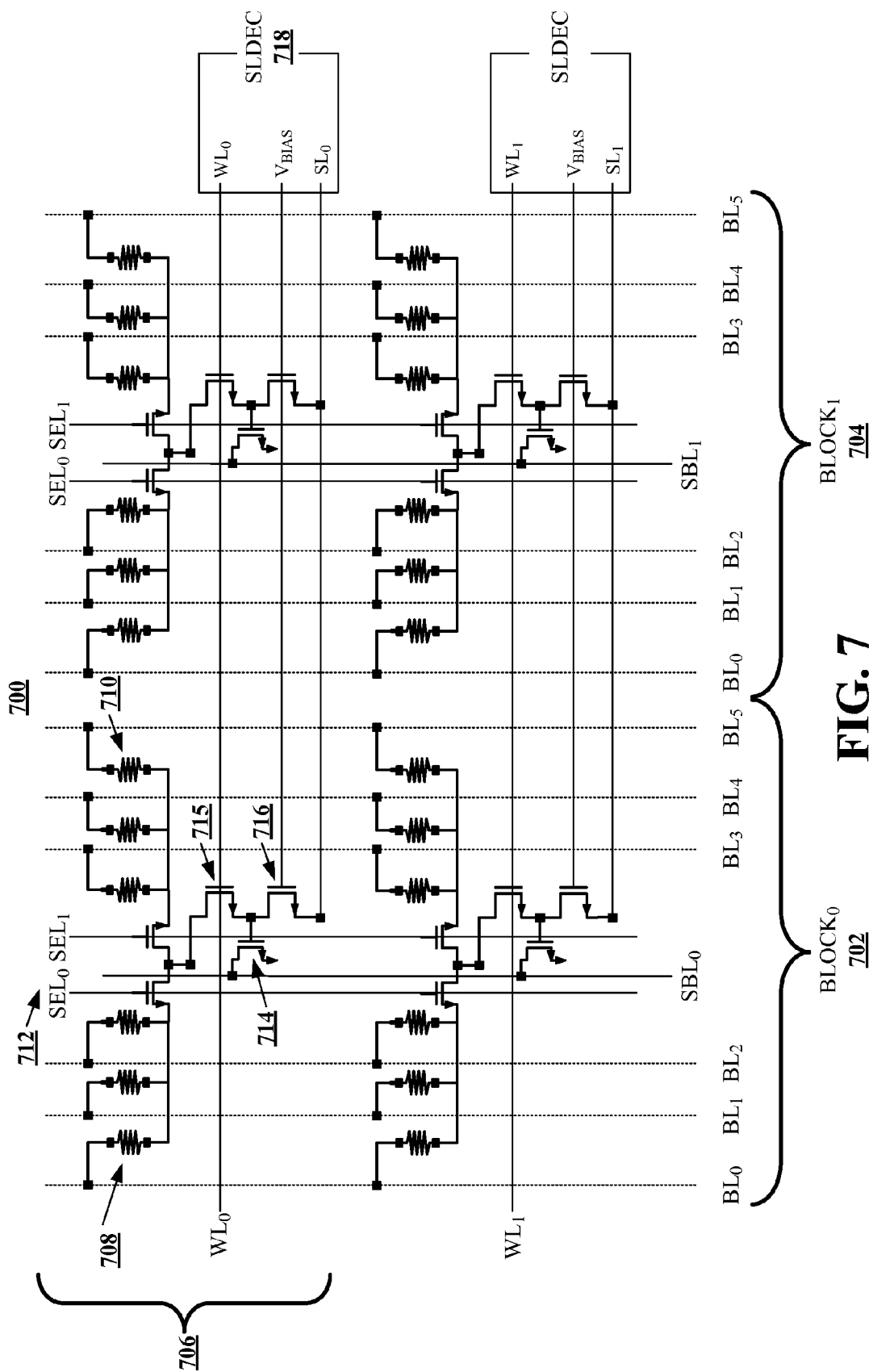
FIG. 7 depicts a diagram of a sample semiconductor layout according to still other aspects of the subject disclosure.

FIG. 7 illustrates a circuit diagram of an example electronic memory 700 according to still other aspects of the subject disclosure. Electronic memory 700 is organized into two blocks of memory cells, including block$_0$ 702 and block$_1$ 704 (referred to collectively as memory blocks 702, 704). Memory blocks 702, 704 comprise respective sets of bitlines as well as two wordlines, $WL_0$ and $WL_1$. It should be appreciated that although electronic memory 700 depicts only two wordlines, a similar architecture to electronic memory 700 can have additional wordlines, above $WL_0$ or below $WL_1$, and likewise a similar architecture to electronic memory 700 can include additional memory blocks to the left of block$_0$ 702 or to the right of block$_1$ 704. In at least one aspect of the subject disclosure, electronic memory 700 can be replicated in a third dimension above or below the page of FIG. 7, for instance.

Electronic memory 700 comprises similar components within block$_0$ 702 and block$_1$ 702, and along wordlines WL$_0$ and WL$_1$. Accordingly, the discussion below focuses on an upper segment 706 of block$_0$ 702. However, the discussion is equally applicable to the lower segment of block$_0$ 702, or the upper or lower segments of block$_1$ 704.

Upper segment 706 of block$_0$ 702 comprises multiple sets of RRAM 708, 710, wherein each set of RRAM 708, 710 comprises a plurality of RRAM devices. Respective RRAM devices are connected at one terminal thereof to respective bitlines of block$_0$ 702. By applying an operating signal to one of these bitlines, respective RRAM devices of sets of RRAM 708, 710 can be respectively operated. For read operations, a pair of select lines 712, including SEL$_0$ and SEL$_1$, facilitate connecting either set of RRAM 708 or set of RRAM 710 to a sensing and pre-charge circuit. The sensing and pre-charge circuit comprises a wordline select transistor 715, a read transistor 714, and a reference transistor 716. The circuit is activated in response to WL$_0$ activating wordline select transistor 715, causing either set of RRAM 708 or set of RRAM 710 to be connected to a gate of read transistor 714. Further, pre-charging is activated by an SLDEC 718 activating reference transistor 716. In this context pre-charging can include pre-charging a local wordline associated with set of RRAM 708 or set of RRAM 710 (e.g., through a pre-charge path comprising reference transistor 716 and wordline select transistor 715), and can include applying a bias voltage to the gate of read transistor 714, or both functions. Pre-charging can mitigate or avoid leakage current among bitlines associated with a set of RRAM 708 or set of RRAM 710, whereas the bias voltage can improve operation of read transistor 714.

In at least one aspect of the subject disclosure, SLDEC 718 can be configured to activate or deactivate WL$_0$, as well as activate or deactivate reference transistors (e.g., reference transistor 716) associated with WL$_0$. SLDEC 718 can be further configured to control a level of the bias voltage applied to the gate of read transistor 714 through a source line SL$_0$ connected to a channel region of reference transistor 716. Additionally, reference transistor 716 and SLDEC 718 can operate as a current source at a suitable level proportional to an off current of RRAM 708, 710, and can be configured to pre-charge the gate of read transistor 714, as described herein.

Electronic memory 700 provides even greater component density than electronic memory 600 of FIG. 6, supra. As depicted, each read transistor 714 can be connected to at least six RRAM devices. It should be appreciated, however, that more than six RRAM devices can be connected to a single read transistor, in alternative embodiments. For instance, more than two sets of RRAM 708, 710 can be connected to read transistor 714 within memory block$_0$ 702. As another example, respective sets of RRAM can include more than three RRAM devices, by incorporating more than three bitlines per set of bitlines per memory block. The high component density of electronic memory 700 or similar embodiments can provide very high memory density, essentially organizing a large number of memory cells within a given amount of silicon space. This architecture can help to further one goal of modern electronic memory, increasing memory capacity of memory chips.

FIG. 8 illustrates a diagram of an example operating table 800 for electronic memory 700 of FIG. 7, in one or more aspects of the subject disclosure. Operating table 800 illustrates example operating voltages for respective signal lines, including bitlines, wordlines, select lines and source lines of electronic memory 700. It should be appreciated, however, that these example operating voltages are not exclusive, and other operating signals and operating voltage levels can be applicable for electronic memory 700 or similar embodiments thereof.

As depicted, operating table 800 includes, on the left side, a read operation, a page erase operation, and a program operation. Each operation comprises two processes, a pre-charge process and a read or execute process. Various shaded regions of operating table 800 highlight a signal change to a particular signal line of electronic memory 700 to implement the respective operation. To read an RRAM device connected to BL$_2$ of WL$_1$, for instance, a change in input signal is applied to five signal lines of electronic memory 700 for pre-charging and sensing of the RRAM device. Likewise, for page erase and program operations, a pre-charge stage is performed and then erase or program is executed with a change in input signal applied to two signal lines, respectively.

Referring to a read operation targeting an RRAM device connected to BL$_2$ of WL$_1$ of electronic memory 700, the pre-charge process comprising raising WL$_1$ to a supply voltage V$_{dd}$, applying 0.5 volts to BL$_2$ of block$_0$ and BL$_2$ of block$_1$, applying 0.5 volts to control line SL$_0$, and applying V$_{dd}$ to V$_{BIAS}$ thereby activating reference transistor 716. The sensing process, to determine a state of the RRAM device, comprising lowering WL$_1$ to 0 volts, applying 1 volt to BL$_2$ of block$_0$ and to BL$_2$ of block$_1$, applying 0 volts to SL$_0$ and applying a reference voltage v$_{ref}$ to V$_{BIAS}$.

Referring to the page erase operation, a pre-charge process comprises applying 0 volts to SL$_0$ and 4 volts to V$_{BIAS}$. An execution process to perform the page erase comprises raising the voltage at SL$_0$ from 0 volts to 3 volts, and maintaining 4 volts at V$_{BIAS}$. This operation will pass the 3 volts to the lower terminal of the RRAM cells and erase all RRAM on the selected WL$_0$ row Referring to a program operation targeting two RRAM devices concurrently, the program pre-charge and execute operations affect RRAM devices connected to BL$_2$ of WL$_0$ of block$_0$ and BL$_2$ of WL$_0$ of block$_1$ of electronic memory 700. The pre-charge process can comprise applying the supply voltage V$_{dd}$ to WL$_1$, applying 3 volts to BL$_2$ of block$_0$ and 3 volts to BL$_2$ of block$_1$, and applying 3 volts to SL$_0$. To execute the programming, an execute process can be performed comprising lowering SL$_0$ to 0 volts, lowering WL$_1$ from V$_{dd}$ to 0 volts and setting BL$_0$ and BL$_1$ of block$_0$ to 1.5 volts to inhibit programming on WL$_1$ and bitlines BL$_0$ and BL$_1$, respectively, and maintaining WL$_0$ at V$_{dd}$ and BL$_2$ at 3 volts to program the RRAM device at BL$_2$ and WL$_0$ of block$_0$.

The aforementioned diagrams have been described with respect to interaction between several components, or memory architectures. It should be appreciated that such diagrams can include those components and architectures specified therein, some of the specified components/architectures, and/or additional components/architectures. For example, a memory cell architecture could include a combination of electronic memory 400 and electronic memory 300. Sub-components could also be implemented as electrically connected to other sub-components rather than included within a parent architecture. Additionally, it should be noted that one or more disclosed processes could be combined into a single process providing aggregate functionality. For instance, a program process can comprise an erase process, or vice versa, to facilitate programming and erasing a semiconductor cell by way of a single process. In addition, it should be appreciated that respective rows of disclosed memory architectures can be erased in groups (e.g., multiple rows erased concurrently) or individually. Moreover, it should be appreciated that multiple RRAM cells on a particular row can be programmed in groups (e.g., multiple RRAM cells programmed concurrently) or individually. Components of the disclosed architectures can also interact with one or more other components not specifically described herein but known by those of skill in the art.

Figure 9:
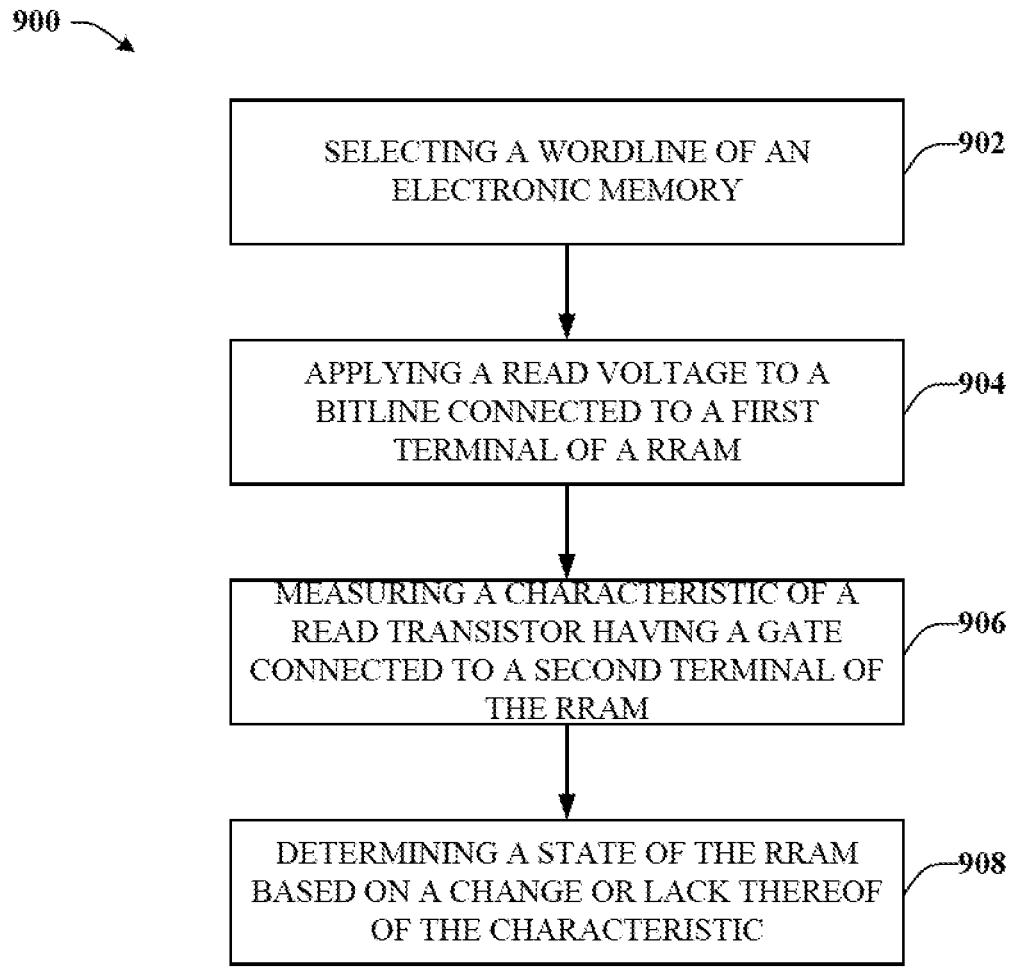
FIG. 9 depicts a flowchart of a sample method for providing high speed RRAM according to further aspects.
Figure 10:
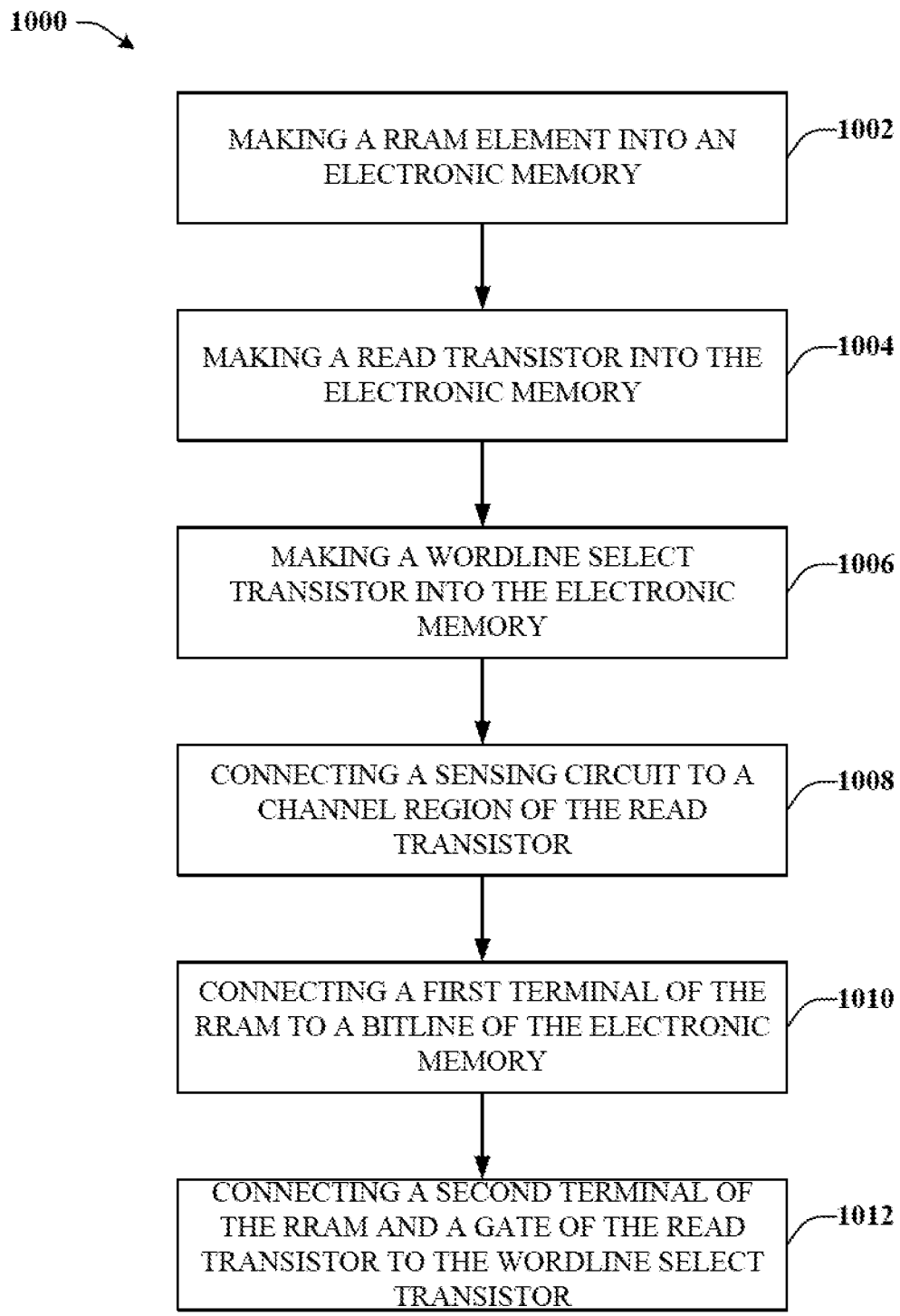
FIG. 10 depicts a flowchart of an example method for fabricating high speed RRAM according to still other aspects.

In view of the exemplary diagrams described supra, process methods that can be implemented in accordance with the disclosed subject matter will be better appreciated with reference to the flow charts of FIGS. 9 and 10. While for purposes of simplicity of explanation, the methods 900, 1000 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods 900, 1000 described hereinafter. Additionally, it should be further appreciated that the methods 900, 1000 disclosed hereinafter and throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 9 illustrates a flowchart of an example method 900 for providing high speed RRAM according to one or more aspects of the subject disclosure. At 902, method 900 can comprise selecting a wordline of an electronic memory device. Selecting the wordline can comprise, for instance, applying a suitable activation signal to the wordline. Selecting the wordline can additionally comprise inhibiting activation of other wordlines of the electronic memory device by refraining from applying the activation signal to other wordlines, allowing the other wordlines to float (e.g., in the event of a non-linear resistance RRAM), or applying an inhibiting voltage to the other wordlines, or the like. At 904, method 900 can comprise applying a read voltage to a bitline connected to a first terminal of a RRAM device. At 906, method 900 can comprise measuring an electrical characteristic of a read transistor having a gate connected to a second terminal of the RRAM. The electrical characteristic can be a voltage characteristic, a current characteristic, or the like. Additionally, at 908, method 900 can comprise determining a state of the RRAM based on a change or lack thereof of the electrical characteristic. For instance, where a change in the electrical characteristic corresponds with an active, or program state of the RRAM, determining the state can comprise determining the RRAM is in a programmed state. Likewise, where a lack of change in the electrical characteristic corresponds with a deactivated, or erased state of the RRAM, determining the state can comprise determining the RRAM is in an erased state. According to particular aspects of the subject disclosure, method 900 can further comprise measuring the electrical characteristic for a duration that is proportional to a capacitance of the gate of the read transistor multiplied by a resistance of the RRAM when the RRAM is activate. In alternate or additional aspects, method 900 can further comprise activating a select transistor to connect one subset of RRAM, of which the RRAM is a member, to the gate of the read transistor, and deactivating or leaving deactivated a second select transistor to isolate a second subset of RRAM from the gate of the read transistor. In at least one additional aspect, method 900 can additionally comprise applying a bias voltage to the gate of the read transistor, wherein the bias voltage is close to be less than a threshold voltage of the read transistor. In yet other aspects, method 900 can comprise pre-charging the RRAM device or a set of RRAM devices in conjunction with (or, e.g., prior to) operating on the RRAM device(s), including performing a read operation, a write operation, or a program operation on the RRAM device(s).

FIG. 10 illustrates a flowchart of a sample method 1000 for fabricating high read speed RRAM for an electronic memory device, according to still other aspects of the subject disclosure. At 1002, method 1000 can comprise making a resistive RRAM element into the electronic memory device. At 1004, method 1000 can comprise making a read transistor into the electronic memory device, and at 1006, method 1000 can comprise making a wordline select transistor into the electronic memory. At 1008, method 1000 can comprise connecting a sensing circuit to a channel region of the read transistor. At 1010, method 1000 can comprise connecting a first terminal of the RRAM element to a bitline of the electronic memory. Particularly, the bitline of the electronic memory can be a sensing bitline that is not connected to operating bitlines (e.g., columns) of the electronic memory device that are utilized to operate on the memory cells (e.g., program, erase, read, . . . ). At 1012, method 1000 can comprise connecting a second terminal of the RRAM element and a gate of the read transistor to opposite channel region terminals (e.g. a source terminal and a drain terminal, respectively) of the wordline select transistor.

Figure 11:
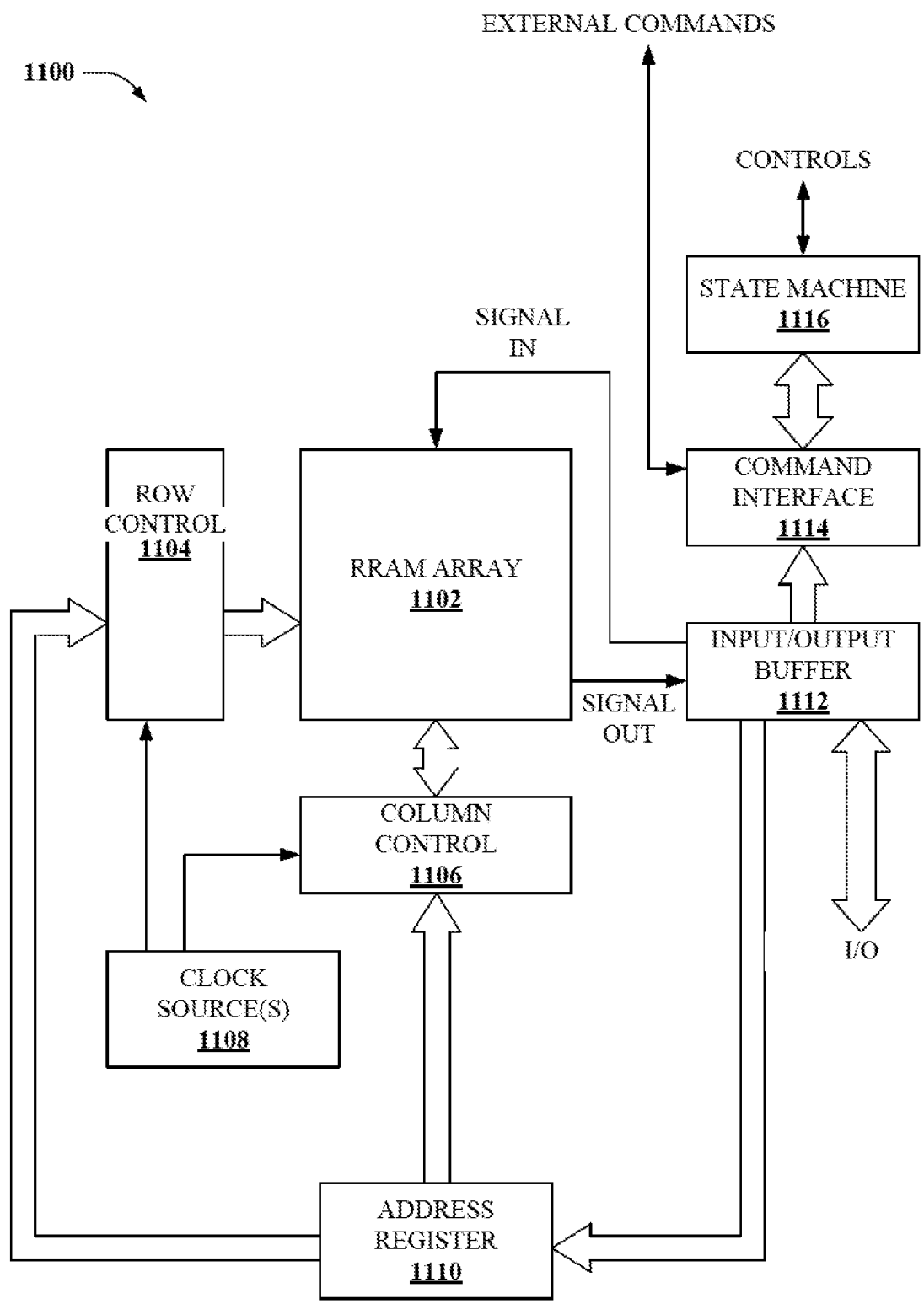
FIG. 11 illustrates a block diagram of an example electronic operating environment according to one or more additional aspects of the subject disclosure.

In order to provide a context for the various aspects of the disclosed subject matter, FIG. 11, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules can be located in both local and remote memory storage modules or devices.

FIG. 11 illustrates a block diagram of an example operating and control environment 1100 for a RRAM array 1102 according to aspects of the subject disclosure. In at least one aspect of the subject disclosure, RRAM array 1102 can comprise a variety of RRAM memory cell technology. Particularly, RRAM array can be arranged to provide high read speed operation, in conjunction with high program and erase speeds of RRAM cells, as described herein.

A column controller 1106 can be formed adjacent to RRAM array 1102. Moreover, column controller 1106 can be electrically coupled with bit lines of RRAM array 1102. Column controller 1106 can control respective bitlines, applying suitable program, erase or read voltages to selected bitlines.

In addition, operating and control environment 1100 can comprise a row controller 1104. Row controller 1104 can be formed adjacent to column controller 1106, and electrically connected with word lines of RRAM array 1102. Row controller 1104 can select particular rows of memory cells with a suitable selection voltage. Moreover, row controller 1104 can facilitate program, erase or read operations by applying suitable voltages at selected word lines.

A clock source(s) 1108 can provide respective clock pulses to facilitate timing for read, write, and program operations of row control 1104 and column control 1106. Clock source(s) 1108 can further facilitate selection of word lines or bit lines in response to external or internal commands received by operating and control environment 1100. An input/output buffer 1112 can be connected to an external host apparatus, such as a computer or other processing device (not depicted) by way of an I/O buffer or other I/O communication interface. Input/output buffer 1112 can be configured to receive write data, receive an erase instruction, output readout data, and receive address data and command data, as well as address data for respective instructions. Address data can be transferred to row controller 1104 and column controller 1106 by an address register 1110. In addition, input data is transmitted to RRAM array 1102 via signal input lines, and output data is received from RRAM array 1102 via signal output lines. Input data can be received from the host apparatus, and output data can be delivered to the host apparatus via the I/O buffer.

Commands received from the host apparatus can be provided to a command interface 1114. Command interface 1114 can be configured to receive external control signals from the host apparatus, and determine whether data input to the input/output buffer 1112 is write data, a command, or an address. Input commands can be transferred to a state machine 1116.

State machine 1116 can be configured to manage programming and reprogramming of RRAM array 1102. State machine 1116 receives commands from the host apparatus via input/output interface 1112 and command interface 1114, and manages read, write, erase, data input, data output, and like functionality associated with RRAM array 1102. In some aspects, state machine 1116 can send and receive acknowledgments and negative acknowledgments regarding successful receipt or execution of various commands.

To implement read, write, erase, input, output, etc., functionality, state machine 1116 can control clock source(s) 1108. Control of clock source(s) 1108 can cause output pulses configured to facilitate row controller 1104 and column controller 1106 implementing the particular functionality. Output pulses can be transferred to selected bit lines by column controller 1106, for instance, or word lines by row controller 1104, for instance.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method, comprising:
   receiving an instruction related to selection of a two-terminal memory cell of a memory device for a read operation;
   selecting a wordline of the memory device that is associated with the selected two-terminal memory cell;
   applying a read signal to a bitline of the memory device, wherein the bitline is connected to a first terminal of the two-terminal memory cell; and
   determining a state of a sensing circuit in response to applying the read signal and in response to selecting the worldline, wherein the sensing circuit comprises a read transistor having a gate selectively connected to a second terminal of the two-terminal memory cell in response to the selecting the worldline, and further wherein the state of the sensing circuit is determinative of a program or erase state of the two-terminal memory cell.

2. The method of claim 1, further comprising applying a precharge
   signal to the bitline during a precharge phase of the read operation, and wherein applying the read signal further comprises applying a transitory read pulse to the bitline during an operation phase of the read operation that follows the precharge phase.

3. The method of claim 1, wherein determining the state of the sensing circuit comprises applying a sensing pulse to the sensing circuit and measuring a transistor current associated with the read transistor during a pulse width of the sensing pulse, the pulse width having a duration related to a capacitance of the gate of the read transistor.

4. The method of claim 1, further comprising determining whether
   the two-terminal memory cell has the program state or the erase state in response to measuring the state of the sensing circuit.

5. The method of claim 4, further comprising outputting the program state in reply to the instruction in response to determining the two-terminal memory cell has the program state, and outputting the erase state in reply to the instruction in response to determining the two-terminal memory cell has the erase state.

6. The method of claim 1, wherein determining the state of the sensing circuit further comprises measuring an electrical characteristic of the read transistor and determining whether the read transistor is in a conductive state or a resistive state.

7. The method of claim 6, further comprising determining the two-terminal
   memory cell to be in the program state in response to determining the read transistor is in the conductive state.

8. The method of claim 6, further comprising determining the two-terminal
   memory cell to be in the erase state in response to determining the read transistor is in the resistive state.

9. The method of claim 1, further comprising applying a precharge
   signal to the wordline or to the bitline during a pre charge phase, wherein the applying the read signal is performed during an operation phase after completion of the precharge phase.

10. The method of claim 1, further comprising activating a select line associated with the two-terminal memory cell that, when activated, selectively connects the second terminal of the two-terminal memory cell to a node controlled by a wordline transistor, the node being selectively connected to the gate of the read transistor in response to the selecting the wordline.

11. The method of claim 10, further comprising deactivating a second
select line associated with a second two-terminal memory cell, the second select line selectively disconnecting a second terminal of the second two-terminal memory cell from the node in response to deactivating the second select line.

12. The method of claim 1, further comprising applying a reference
bias to the gate of the read transistor, the reference bias having a positive magnitude smaller than a switching bias associated with switching the read transistor into a conductive state.

13. A method, comprising:
receiving an instruction selecting a two-terminal memory cell of a memory device for a program operation;
initiating a pre charge phase of the program operation;
applying a first precharge signal to a wordline of the memory device associated with the two-terminal memory cell;
applying a second pre charge signal to a bitline that is connected to a first terminal of the two-terminal memory device, wherein a second terminal of the two-terminal memory device is selectively connected to a gate of a read transistor;
applying a third precharge signal via a pre-charge path to the gate of the read transistor and the second terminal of the two-terminal memory device; and
initiating an operation phase of the program operation to program the two-terminal memory cell.

14. The method of claim 13, further comprising changing the first precharge signal to zero volts or ground to the wordline of the memory device during the operation phase of the program operation.

15. The method of claim 13, further comprising changing the third
precharge signal to zero volts or ground during the operation phase of the program operation, and applying the zero volts or the ground to the gate of the read transistor and the second terminal of the two-terminal memory device.

16. The method of claim 13, wherein the second precharge signal and
the third precharge signal have a magnitude of about three volts during the precharge phase of the program operation.

17. The method of claim 13, further comprising maintaining the second precharge signal to the bitline during the precharge phase of the program operation.

18. An electronic device, comprising:
an array of memory cells comprising at least one two-terminal memory cell having a first terminal connected to a bitline of the array and a second terminal selectively connected to or disconnected from a gate of a read transistor;
a command interface configured to receive an instruction pertaining to performing a memory operation with respect to the array of memory cells; and
a controller configured to control perform the memory operation on the at least one two-terminal memory cell via one or more signal inputs in response to receipt of the instruction at the command interface and processing of the command, the controller being further configured to:
apply an operation signal to the bitline of the array;
electrically connect the second terminal of the at least one two-terminal memory cell to the gate of the read transistor; and
initiate a sensing circuit to measure a state of the read transistor and determine a corresponding state of the at least one two-terminal memory cell at least in part based on the state of the read transistor.

19. The electronic device of claim 18, wherein:
the at least one two-terminal memory cell is a resistive switching memory cell;
the read transistor is a three-terminal metal oxide semiconductor transistor; and
the controller initiates the sensing circuit for a time period related to a capacitance of the gate of the read transistor.

20. The electronic device of claim 18, further comprising a reference transistor configured to facilitate application of a precharge voltage to the gate of the read transistor or the second terminal of the at least one two-terminal memory cell, wherein the precharge voltage can be selected to have a magnitude equal to the operation signal in response to the instruction pertaining to a program operation, and wherein the precharge voltage can be selected to have a magnitude greater than zero and smaller than a threshold voltage associated with activation of the read transistor in response to the instruction pertaining to a read operation.

* * * * *